US011137560B2

(12) United States Patent
Iida et al.

(10) Patent No.: US 11,137,560 B2
(45) Date of Patent: Oct. 5, 2021

(54) SEMICONDUCTOR MODULE, MANUFACTURING METHOD THEREOF, AND COMMUNICATION METHOD USING THE SAME

(71) Applicant: RENESAS ELECTRONICS CORPORATION, Tokyo (JP)

(72) Inventors: Tetsuya Iida, Ibaraki (JP); Yasutaka Nakashiba, Ibaraki (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 16/408,100

(22) Filed: May 9, 2019

(65) Prior Publication Data

US 2019/0372676 A1 Dec. 5, 2019

(30) Foreign Application Priority Data

May 31, 2018 (JP) .............................. JP2018-104842

(51) Int. Cl.
*G02B 6/42* (2006.01)
*H01L 23/00* (2006.01)
*H04B 10/80* (2013.01)
*H01L 25/16* (2006.01)

(52) U.S. Cl.
CPC .......... *G02B 6/4274* (2013.01); *H01L 25/167* (2013.01); *G02B 6/42* (2013.01); *G02B 6/4206* (2013.01); *H01L 24/08* (2013.01); *H01L 24/09* (2013.01); *H01L 24/80* (2013.01); *H01L 2224/08145* (2013.01); *H01L 2224/09517* (2013.01); *H04B 10/801* (2013.01)

(58) Field of Classification Search
None
See application file for complete search history.

(56) References Cited

U.S. PATENT DOCUMENTS 7,229,219 B2* 6/2007 Lee ...................... G02B 6/4232
385/91
9,541,718 B2 1/2017 Ogura et al.
2002/0097962 A1* 7/2002 Yoshimura .............. H01L 23/48
385/50

(Continued)

FOREIGN PATENT DOCUMENTS

JP      H8-201666 A      8/1996
JP      2004-133446 A    4/2004

(Continued)

OTHER PUBLICATIONS

Office Action issued in JP Application No. 2018-104842, dated Aug. 10, 2021 w/English Translation.

*Primary Examiner* — Michelle R Connelly
(74) *Attorney, Agent, or Firm* — McDermott Will & Emery LLP

(57) ABSTRACT

The semiconductor module includes a first semiconductor chip and a second semiconductor chip. The first semiconductor chip includes an optical device such as an optical waveguide and wiring formed over the optical device. The second semiconductor chip include semiconductor elements such as MISFET, and wiring formed over the semiconductor elements. A top surface of the first semiconductor chip is laminated with a top surface of the second semiconductor chip such that the first and second wirings are directly contacted with each other.

17 Claims, 16 Drawing Sheets

(56) References Cited

U.S. PATENT DOCUMENTS

| | | | |
|---|---|---|---|
| 2004/0057667 A1* | 3/2004 | Yamada | G02B 6/1228 |
| | | | 385/43 |
| 2009/0294814 A1 | 12/2009 | Assefa et al. | |
| 2009/0297091 A1 | 12/2009 | Assefa et al. | |
| 2009/0297093 A1* | 12/2009 | Webster | G02B 6/1228 |
| | | | 385/14 |
| 2010/0111469 A1* | 5/2010 | Pyo | G02B 6/30 |
| | | | 385/14 |
| 2010/0119192 A1* | 5/2010 | Fujikata | G02B 6/4204 |
| | | | 385/14 |
| 2010/0320496 A1* | 12/2010 | Nishi | H01L 23/481 |
| | | | 257/98 |
| 2011/0038588 A1* | 2/2011 | Kim | G02B 6/124 |
| | | | 385/131 |
| 2016/0020240 A1* | 1/2016 | Hayashi | H01L 27/1461 |
| | | | 257/432 |
| 2017/0115458 A1 | 4/2017 | Mekis et al. | |
| 2017/0139142 A1* | 5/2017 | Patel | G02B 6/305 |
| 2018/0100970 A1* | 4/2018 | Park | G02B 6/305 |
| 2018/0188459 A1* | 7/2018 | Mekis | H04B 10/501 |
| 2018/0227549 A1* | 8/2018 | Cai | G02B 6/12002 |

FOREIGN PATENT DOCUMENTS

| | | | |
|---|---|---|---|
| JP | 2006-85177 A | | 3/2006 |
| JP | 2011203604 A | * | 10/2011 |
| JP | 2017-151146 A | | 8/2017 |
| WO | 2009/107742 A1 | | 9/2009 |
| WO | 2014/156962 A1 | | 10/2014 |

* cited by examiner

SEMICONDUCTOR MODULE, MANUFACTURING METHOD THEREOF, AND COMMUNICATION METHOD USING THE SAME

CROSS-REFERENCE TO RELATED APPLICATIONS

The disclosure of Japanese Patent Application No. 2018-104842 filed on May 31, 2018 including the specification, drawings and abstract is incorporated herein by reference in its entirety.

BACKGROUND

The present invention relates to a semiconductor module, a method of manufacturing the same, and a communication method using the same, and can be suitably applied to, for example, a semiconductor module that performs propagation of an optical signal and an electrical signal.

In recent years, a silicon photonics technique has been developed as a semiconductor device for performing optical communication. In the silicon photonics technique, a transmission line for an optical signal using a semiconductor such as silicon as a material is formed on a semiconductor substrate, and a photonics chip in which various optical devices formed by the transmission line for the optical signal and electronic devices are integrated is used. Further, integration of a semiconductor module that performs propagation of optical and electrical signals by mounting a driver chip for controlling the photonics chip on the photonics chip has been studied.

Japanese Unexamined Patent Application Publication No. 2017-151146, International Publication WO No. 2014/156962, U.S. Patent Application Publication No. 2009/0294814 and U.S. Patent Application Publication No. 2009/0297091 disclose a technique of mounting a driver chip on a substrate on which an optical device such as an optical waveguide is formed.

SUMMARY

In a semiconductor module for optical communication having a photonics chip, the size of the photonics chip is often larger than the size of a driver chip on which an electronic circuit composed of semiconductor elements is formed. This is because, in the photonics chip, the propagation loss is very small even if the transmission distance of light becomes long, and therefore, in the driver chip, the shortest transmission distance of electricity can reduce the overall propagation loss and minimize the power consumption. Further, light input and output can be performed from the direction of the top surface side of the photonic chip or the direction of the side surface side of the photonic chip.

However, in such a semiconductor module that performs propagation of an optical signal and an electrical signal, it is difficult to maximize the data transmission amount (band density) per volume between the photonics chip and the driver chip, and to improve the efficiency (power consumption per information amount) of data transmission energy. In addition, since the degree of design freedom for high integration of the semiconductor module is low, there is a problem that it is difficult to cope with miniaturization of the semiconductor module.

Other objects and novel features will become apparent from the description of this specification and the accompanying drawings.

According to embodiments, a semiconductor module includes an optical device, a first semiconductor chip including a first wiring formed over the optical device, a semiconductor element constituting a part of an electric circuit, and a second semiconductor chip including a second wiring formed over the semiconductor element. Here, the second semiconductor chip is mounted on the first semiconductor chip, and the surface of the first semiconductor chip is bonded to the surface of the second semiconductor chip such that the first wiring and the second wiring are in direct contact with each other.

Effect of the Invention

According to embodiments, the performance of the semiconductor module can be improved.

DETAILED DESCRIPTION

Figure 1:
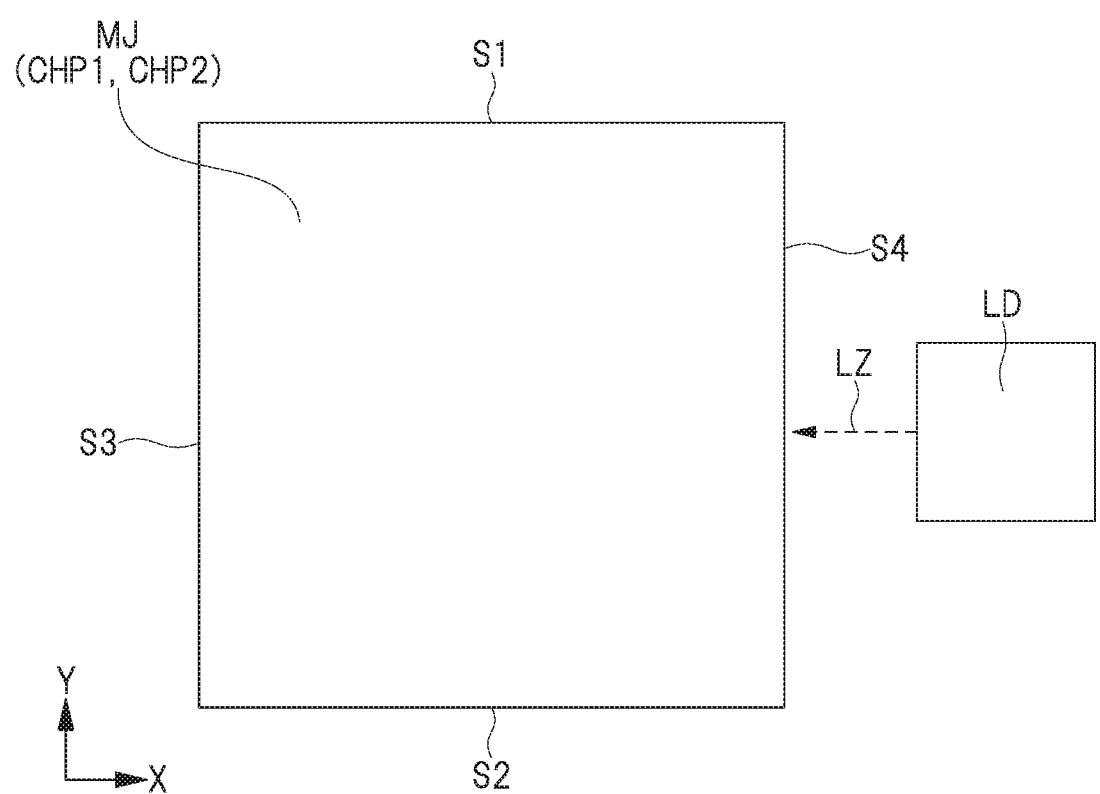
FIG. 1 is a plan view illustrating a semiconductor module according to a first embodiment.

In the following embodiments, when it is necessary for convenience, the description will be made by dividing into a plurality of sections or embodiments, but except for the case where it is specifically specified, they are not independent of each other, and one of them is related to some or all of modifications, details, supplementary description, and the like of the other. In the following embodiments, reference to the number of elements or the like (including the number, numerical value, quantity, range, and the like) is not limited to the specific number, and may be greater than or equal to the specific number or less, except in the case where it is specifically specified and the case where it is obviously limited to the specific number in principle. Furthermore, in the following embodiments, it is needless to say that the constituent elements (including the element steps and the like) are not necessarily essential except in the case where they are specifically specified and the case where they are considered to be obviously essential in principle. Similarly, in the following embodiments, reference to shapes, positional relationships, and the like of constituent elements and the like includes substantially approximate or similar shapes and the like, except for the case in which they are specifically specified and the case in which they are considered to be obvious in principle and the like. The same applies to the above numerical values and ranges.

In all the drawings for explaining the embodiments, members having the same functions are denoted by the same reference numerals, and repetitive descriptions thereof are omitted. In the following embodiments, descriptions of the same or similar parts will not be repeated in principle except: when particularly necessary. In the cross-sectional view used in the embodiment, hatching or the like may be omitted in order to make the drawing easier to see.

A First Embodiment

Figure 2:
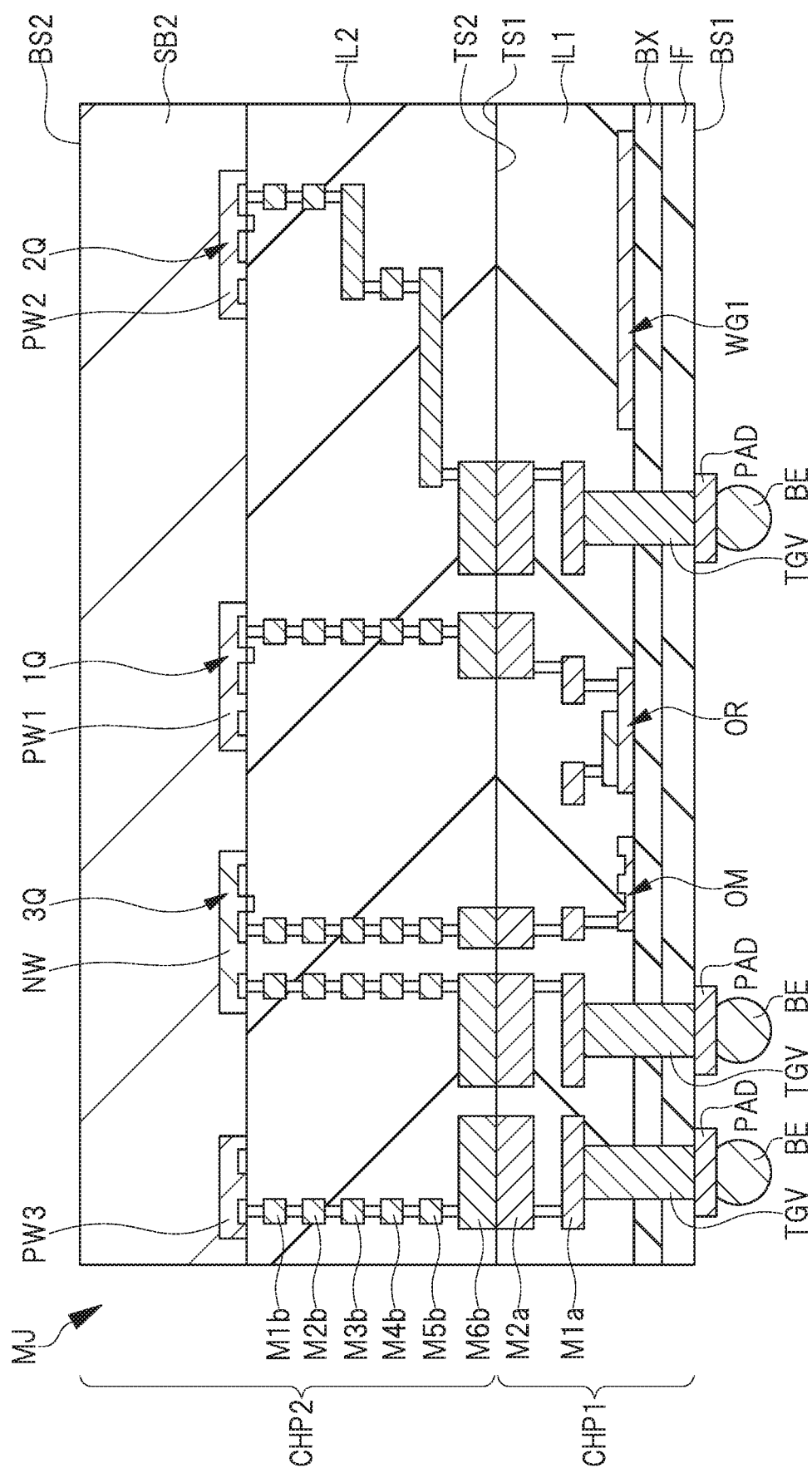
FIG. 2 is a cross-sectional view illustrating a semiconductor module according to a first embodiment.

FIG. 1 is a plan view of a semiconductor module MJ which is a semiconductor device for propagating optical and electrical signals, and FIG. 2 is a cross-sectional view of the semiconductor module MJ. The semiconductor module MJ includes a semiconductor chip CHP1 and a semiconductor chip CHP2 mounted on the semiconductor chip CHP1. The semiconductor chip CHP1 is a photonics chip with optical devices such as optical waveguides. The semiconductor chip CHP2 is a driver chip which transmits electrical signals to the semiconductor chip CHP1 and in which electrical circuits such as CPUs (central processing unit) are formed.

As shown in FIG. 1, a laser diode chip LD having a light-emitting portion that emits laser light LZ is provided as an optical communication device external to the semiconductor module MJ. The semiconductor chip CHP1 of the semiconductor module MJ can receive the laser light LZ from the laser diode chip LD directly or via an optical fiber, and can transmit and receive light to and from an optical communication device such as an optical fiber attached external with the semiconductor module MJ, although not shown. That is, it can be said that the semiconductor module MJ s an interposer for optical communication capable of transmitting and receiving light.

As will be described later in detail, the planar size of the semiconductor chip CHP1 is substantially the same as the planar size of the semiconductor chip CHP2. As shown in FIG. 1, in plan view, the semiconductor module MJ has a first side S1 and a second side S2 along the X-direction, and a third side S3 and a fourth side S4 along the Y-direction, and a semiconductor chip CHP1 and a semiconductor chip CHP2 have corresponding first side S1 to fourth side S4. The X direction and the Y direction cross each other and are orthogonal to each other.

Here, when exemplified using the first side S1, in plan view, the position of the first side S1 of the semiconductor chip CHP1 coincides with the position of the first side S1 of the semiconductor chip CHP2 in a range of 5 µm or less. Such a relationship is the same for each of the second side S2 to the fourth side S4.

That is, in plan view, the outer periphery of the semiconductor chip CHP1 coincides with the outer periphery of the semiconductor chip CHP2 within a predetermined range, and specifically coincides with the outer periphery of the semiconductor chip CHP2 in a range of 5 µm or less. In other words, the side surface of the semiconductor chip CHP1 and the side surface of the semiconductor chip CHP2 are flush with each other. In other words, the deviation between the positions of the first side S1 to the fourth side S4 of the semiconductor chip CHP1 and the positions of the first side S1 to the fourth side S4 of the semiconductor chip CHP2 is 5 µm or less, respectively.

In the following embodiment, when the planar size of the semiconductor chip CHP1 and the planar size of the semiconductor chip CHP2 are the same or substantially the same, as described above, it means that the outer circumference of the semiconductor chip CHP1 coincides with the outer circumference of the semiconductor chip CHP2 in a range of 5 µm or less.

The structures of the semiconductor chips CHP1 and CHP2 included in the semiconductor module MJ according to the present embodiment will be described below with reference to FIG. 2. As shown in FIG. 2, the semiconductor chip CHP1 has a top surface TS1 and a back surface BS1, and the semiconductor chip CHP2 has a top surface TS2 and a back surface BS2. The top surfaces TS1 and TS 2 face each other and are laminated with each other. That is, FIG. 2 shows a state in which the semiconductor chip CHP2 is inverted.

In the cross-sectional view of FIG. 2, the side surface of the semiconductor module MJ, which is the side surface of the semiconductor module MJ on the semiconductor chip CHP1, close to the optical waveguide WG1 corresponds to the side S4 shown in FIG. 1.

(Structure of Semiconductor Chip CHP1)

In the present embodiment, as main components included in the semiconductor chip CHP1, an optical waveguide WG1, which is an optical device, an optical modulator OM, and an optical receiver OR are shown.

The optical waveguide WG1, the optical modulator OM, and the optical receiver OR are formed on the insulating film BX, respectively, and are formed by processing the same semiconductor layer. Such a semiconductor layer is comprised of, for example, silicon. The insulating layer EX is comprised of, for example, silicon oxide and has a thickness of, for example, 500 nm to 3 µm.

The optical waveguide WG1 is mainly a propagation path of an optical signal for optically connecting each optical device, and is formed of, for example, a semiconductor layer. Although not shown in detail in the drawings of the present embodiment, the optical waveguide WG1 is connected with other optical devices such as an optical modulator OM and the optical receiver OR.

The semiconductor layer constituting the optical modulator OM includes, for example, p-type, i-type (intrinsic semiconductor) and n-type regions, and these regions constitute a pin structure. The p-type and n-type regions are electrically connected with an upper wiring Mia via plugs or the like, respectively. By changing the carrier density in the semiconductor layer by the voltage supplied from the wiring M1a, the refractive index in the semiconductor layer changes. As result, the effective refractive index with respect to the light propagating through the optical modulator OM changes, and the phase of the light output from the optical modulator OM can be changed.

The optical receiver OR includes, for example, a semiconductor layer into which a p-type impurity is introduced, and an i-type germanium layer formed on the p-type semiconductor layer and having an n-type surface, and a pin structure is formed of these layers. The n-type germanium layer and the p-type semiconductor layer are electrically connected with the upper wiring Mia via the plugs or the like, respectively. As a result, the direct current flowing by the photovoltaic effect in the pin structure can be taken out to the outside of the optical receiver OR.

As will be described later, in the semiconductor chip CHP1, the semiconductor substrate SB1 is removed from the back surface BS1 of the semiconductor chip CHP1. Therefore, the optical receiver OR can receive light from an optical communication device external with the semiconductor module MJ on the back surface BS1 side.

An interlayer insulating film IL1 comprised of, for example, silicon oxide is formed over/on the optical waveguide WG1, the optical modulator OM, and the optical receiver OR. As described above, the periphery of each of the optical waveguide WG1, the optical modulator OM, and the optical receiver OR is covered with the insulating film BX and the interlayer insulating film IL1 made of the same material. The insulating film BX and the interlayer insulating film IL1 are comprised of a material having a refractive index lower than that of the materials constituting the optical waveguide WG1, the optical modulator OM, and the optical receiver OR. Therefore, the optical waveguide WG1, the optical modulator OM, and the optical receiver OR function as the core layer of the optical device, and the insulating film BX and the interlayer insulating film IL1 function as the cladding layer of the optical device.

In the interlayer insulating film IL1, a first-laver wiring M1a and a second-layer wiring M2a are formed over the wiring M1a. Actually, the interlayer insulating film IL1 is formed of a laminated film of a multilayer insulating film, and the wiring M1a and the wiring M2a are formed in the insulating films of the respective layers; however, in the present embodiment, such a multilayer insulating film is illustrated as the interlayer insulating film IL1. The optical device is electrically connected with the wiring M1a and the wiring M2a. The wirings M1a and M2a are wirings having a so-called damascene structure or a dual damascene structure, and are formed of a conductive film mainly comprised of copper. The damascene structure or the dual damascene structure is a wiring structure formed by forming a groove in an insulating film such as the interlayer insulating film IL1, filling a conductive film mainly comprised of copper in the groove via a barrier metal film such as a tantalum nitride film, and then removing the barrier metal film and the conductive film outside the groove by a CMP (chemical mechanical polishing) method.

An insulating film BX is formed below the optical device, and an insulating film IF comprised of, for example, silicon oxide is further formed on the lower surface of the insulating film BX.

The insulating film BX and the semiconductor layers used for the optical waveguide WG1, die optical modulator OM, the optical receiver OR, and the like are originally part of an SOI (Silicon on Insulator) substrate. In this embodiment, the semiconductor substrate SB1 which is a supporting substrate for an SOI substrate is removed. At this time, a part of the insulating film BX is also removed, the thickness of the insulating film BX becomes thin, and there is a possibility that the thickness of the insulating film BX cannot be maintained to the extent that the insulating film BX can function as a cladding layer. Therefore, the insulating layer IF also serves as a cladding layer on the back surface BS1 of the semiconductor chip CHP1. Note that the insulating film IF is not indispensable in the present embodiment as long as this objective can be sufficiently achieved only by the insulating film EX.

Pad electrodes PAD having, for example, a copper film or an aluminum film are formed on the lower surface side of the insulating film IF, i.e., the back surface BS1 side of the semiconductor chip CHP1. The pad electrode PAD is electrically connected with the wiring M1a via the through electrode TGV. The penetration electrode TGV is formed by embedding a conductive film made of copper, for example, in a hole formed by penetrating the insulating film BX and the insulating film IF and removing a part of the interlayer insulating film IL1 such that the penetration electrode TGV reaches the wiring M1a from the back surface BS1 side.

A bump electrode BE comprised of solder, for example, is formed on the lower surface of the pad electrode PAD as an external connection terminal. Although not shown, the bump electrodes BE are connected to other wiring substrates or other semiconductor chips. Accordingly, the semiconductor chip CHP1 can transmit electrical signals to electrical devices external with the semiconductor modules MJ, such as other printed circuit boards or other semiconductor chips.

(Structure of Semiconductor Chip CHP2)

In the present embodiment, MISFET1Q to 3Q, which are semiconductor elements, are shown as main configurations included in the semiconductor chip CHP2.

A semiconductor substrate SB2 comprised of silicon into which a p-type impurity is introduced is provided on the back surface BS2 of the semiconductor chip CHP2. Therefore, the back surface of the semiconductor substrate SB2 is the back surface BS2 of the semiconductor chip CHP2.

On the surface of the semiconductor substrate SB2, p-type well regions PW1 to PW3 and n-type well regions NW are formed. In this embodiment, a MISFET1Q is formed in the well region PW1, a MISFET2Q is formed in the well region PW2, a capacitor is formed in the well region PW3, and a MISFET3Q is formed in the well region NW. These MISFET1Q to 3Q are semiconductor elements constituting a part of electric circuits formed in the semiconductor chips CHP2.

Note that although detailed descriptions are omitted, the MISFET1Q and the MISFET2Q are n-type transistors and include n-type source regions, n-type drain regions, a gate insulating film, and gate electrodes. The MISFET3Q is a p-type transistor and includes a p-type source region, a p-type drain region, a gate insulating film, and gate electrodes. The well region PW3 constitutes a capacitive element having an n-type diffusion region and a p-type diffusion region, and the capacitive element is provided, for example, as a part of an AC high-pass filter of an analog circuit.

An interlayer insulating film IL2 is formed on the semiconductor substrate SB2 such that the interlayer insulating film IL2 covers the semiconductor elements MISFET1Q to 3 Q, and a multilayer interconnection layer is formed in the interlayer insulating film IL2 over the semiconductor elements. In FIG. 2, wirings M1b to M6b are shown as such multilayer wiring layers, and the semiconductor element is electrically connected with the wirings M1b to M6b. The wirings M1b to M6b have a damascene structure or a dual damascene structure, for example, similarly to the wirings M1a and M2a of the semiconductor chip CHP1. Actually, the interlayer insulating film IL2 is formed of a laminated film of a multilayer insulating film, and the wirings M1b to M6b are formed in the insulating films of the respective layers, but in the present embodiment, such a multilayer insulating film is illustrated as the interlayer insulating film IL2.

(Configuration and Feature of Semiconductor Module MJ)

The semiconductor module MJ in the present embodiment has a semiconductor chip CHP1 and a semiconductor chip CHP2, and the top surface TS1 of the semiconductor chip CHP1 and the top surface TS2 of the semiconductor chip CHP2 are laminated with each other. Specifically, the upper surface of the interlayer insulating film IL1 of the semiconductor chip CHP1 is laminated with the upper surface of the interlayer insulating film IL2 of the semiconductor chip CHP2, and the upper surface of the wiring M2a which is the uppermost layer wiring of the semiconductor chip CHP1 is laminated to the upper surface of the wiring M6b which is the uppermost layer wiring of the semiconductor chip CHP2.

In this manner, the semiconductor chip CHP1 and the semiconductor chip CHP2 can transmit electrical signals via the wirings M2a and M6b directly contacted with each other. In addition, electrical signals can be transmitted from electrical devices external with the semiconductor chip CHP1, such as other printed circuit boards or other semiconductor chips, to the semiconductor chip CHP2 via the bump electrodes BE of the semiconductor chip CHP1. The semiconductor chip CHP1 can transmit and receive light to and from optical communication devices external with the semiconductor modules MJ, such as the laser diode chip LD and the optical fibers.

Hereinafter, a communication method between the semiconductor module MJ and optical communication devices and electrical devices external with the semiconductor module MJ will be described.

When converting an electrical signal into an optical signal, first, a first electrical signal from an electric device external with the semiconductor module MJ is received in the semiconductor chip CHP1 via the bump electrodes BE, the through electrodes TGV, and the wirings M1a. Next, the first electrical signals received by the semiconductor chip CHP1 are transmitted from the semiconductor chip CHP1 to the semiconductor chip CHP2 via the wirings M2a and M6b. Next, the first electrical signal received by the semiconductor chip CHP2 is processed into a second electrical signal or the like by using MISFET1Q to 3Q of the semiconductor chip CHP2 or the like. Next, the second electrical signals are transmitted from the semiconductor chip CHP2 to the semiconductor chip CHP1. Next, the second electrical signal received by the semiconductor chip CHP1 is converted into an optical signal by using the optical devices of the semiconductor chip CHP1, i.e., the optical waveguide WG1, the optical modulator OM, and the optical receiver OR. Thereafter, the optical signal is transmitted to an optical communication device such as an optical fiber external with the semiconductor module MJ.

In the case of converting an optical signal into an electrical signal, a communication path opposite to the above may be followed. That is, first, optical signals from an optical communication device such as a laser diode chip LD external with the semiconductor module MJ are received by the semiconductor chip CHP1. Next, the optical signal received by the semiconductor chip CHP1 is converted into a third electrical signal by using the optical devices of the semiconductor chip CHP1. Next, the third electrical signals are transmitted from, the semiconductor chip CHP1 to the semiconductor chip CHP2. Next, the third electrical signal received by the semiconductor chip CHP2 is processed into a fourth electrical signal or the like by using the MISFET1Q of the semiconductor chip CHP2 to 3Q or the like. Thereafter, the fourth electrical signals are transmitted to the electric devices external with the semiconductor modules MJ via the bump electrodes BE, the through electrodes TGV, the wirings M1a and the wirings M2a of the semiconductor chips CHP1.

In the prior art, the planar size of the semiconductor chip CHP1, which is a photonic chip, is formed to be larger than the planar size of the semiconductor chip CHP2, which is a driver chip, as shown in the above-mentioned Patent Application Publication and the like.

In contrast, in the present embodiment, as described with reference to FIG. 1, the planar size of the semiconductor chip CHP1 and the planar size of the semiconductor chip CHP2 are the same. More specifically, in plan view, the outer periphery of the semiconductor chip CHP1 coincides with the outer periphery of the semiconductor chip CHP2 in a range of 5 μm or less.

Therefore, since the mounting densities of the semiconductor chip CHP1 and the semiconductor chip CHP2 are maximized, the data transmission quantity per unit volume can be maximized between the two chips, and the efficiency of the data transmission energy can be improved. Accordingly, the performance of the semiconductor modules MJ having the semiconductor chip CPI and the semiconductor chip CHP2 can be improved.

In addition, since the planar size of the semiconductor chip CHP1 can be made the same as the planar size of the semiconductor chip CHP2, the semiconductor module MJ can be highly integrated, and miniaturization of the semiconductor module MJ can be achieved.

Further, in the prior art, as shown in the above-mentioned prior art document, since the photonics chip is laminated to the driver chip via only the interlayer insulating film, the laminating strength of the photonics chip and the driver chip is not sufficient.

On the other hand, in the present embodiment, the wiring M2a of the semiconductor chip CHP1 and the wiring M6b of the semiconductor chip CHP2 are directly laminated with each other on the top surface TS1 of the semiconductor chip CHP1 and the top surface TS2 of the semiconductor chip CHP2. Therefore, the resistivity between the semiconductor chip CHP1 and the semiconductor chip CHP2 can be minimized, and the laminating strength between the semiconductor chip CHP1 and the semiconductor chip CHP2 can be increased. Therefore, it is possible to maximize the efficiency of the data transmission energy between the semiconductor chip CHP1 and the semiconductor chip CHP2. Connections between the semiconductor chip CHP1 and the semiconductor chip CHP2 can be achieved by routing the laminated wiring composed of the wiring M2a and the wiring M6b. That is, since the wiring can be routed to a desired position in the semiconductor chip CHP1 and the semiconductor chip CHP2 by the stacked wiring having a large thickness, the degree of freedom of designing is increased and the wiring resistivity can be suppressed to be low.

(Method of Manufacturing the Semiconductor Module MJ)

Hereinafter, a method of manufacturing the semiconductor module MJ of the present embodiment will be described with reference to FIGS. 3 to 6. Although FIGS. 3 to 6 are described focusing on a region where the semiconductor module MJ of FIG. 2 is finally formed, FIGS. 3 to 6 are actually cross-sectional views of a manufacturing step in a wafer state in which a plurality of fields where the semiconductor module MJ is formed are provided.

Figure 3:
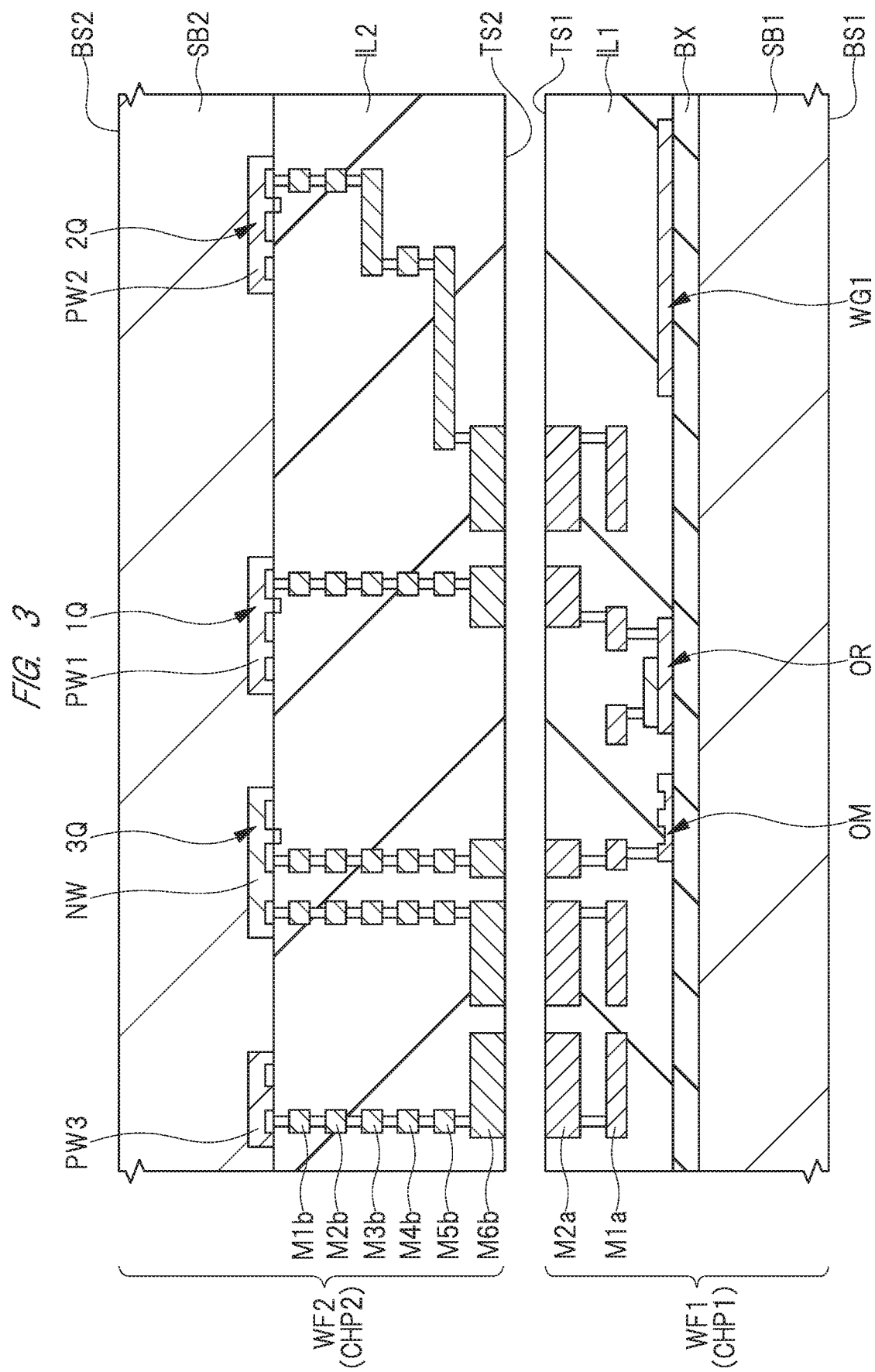
FIG. 3 is a cross-sectional view illustrating a manufacturing step of a semiconductor module according to the first embodiment.

First, as shown in FIG. 3, a wafer WF1 having a plurality of regions to be semiconductor chips CHP1 and a wafer WF2 having a plurality of regions to be semiconductor chips CHP2 are prepared.

In the wafer WF1, an insulating film BX is formed on the semiconductor substrate SB1, and optical devices such as the optical waveguide WG1, the optical modulator ON, and the optical receiver OR, the interlayer insulating film IL1, the wiring M1a, and the wiring M2a are formed on the insulating film BX. Note that the semiconductor substrate SB1, the insulating film BX, and the semiconductor layers used for the optical waveguide WG1, the optical modulator OM, the optical receiver OR, and the like are each a part of the SOI substrate.

In wafer WF2, MISFET1Q to 3Q are formed on semiconductor substrate SB2 and interlayer insulating film IL2 and wiring M2a to M6b are formed on MISFET1Q to 3Q.

After preparing the wafer WF1 and the wafer WF2, the wafer WF2 is inverted with respect to the wafer WF1 or the wafer WF1 is inverted with respect to the wafer WF2 so that the top surface TS1 of the wafer WF1 and the top surface TS2 of the wafer WF2 face each other.

Figure 4:
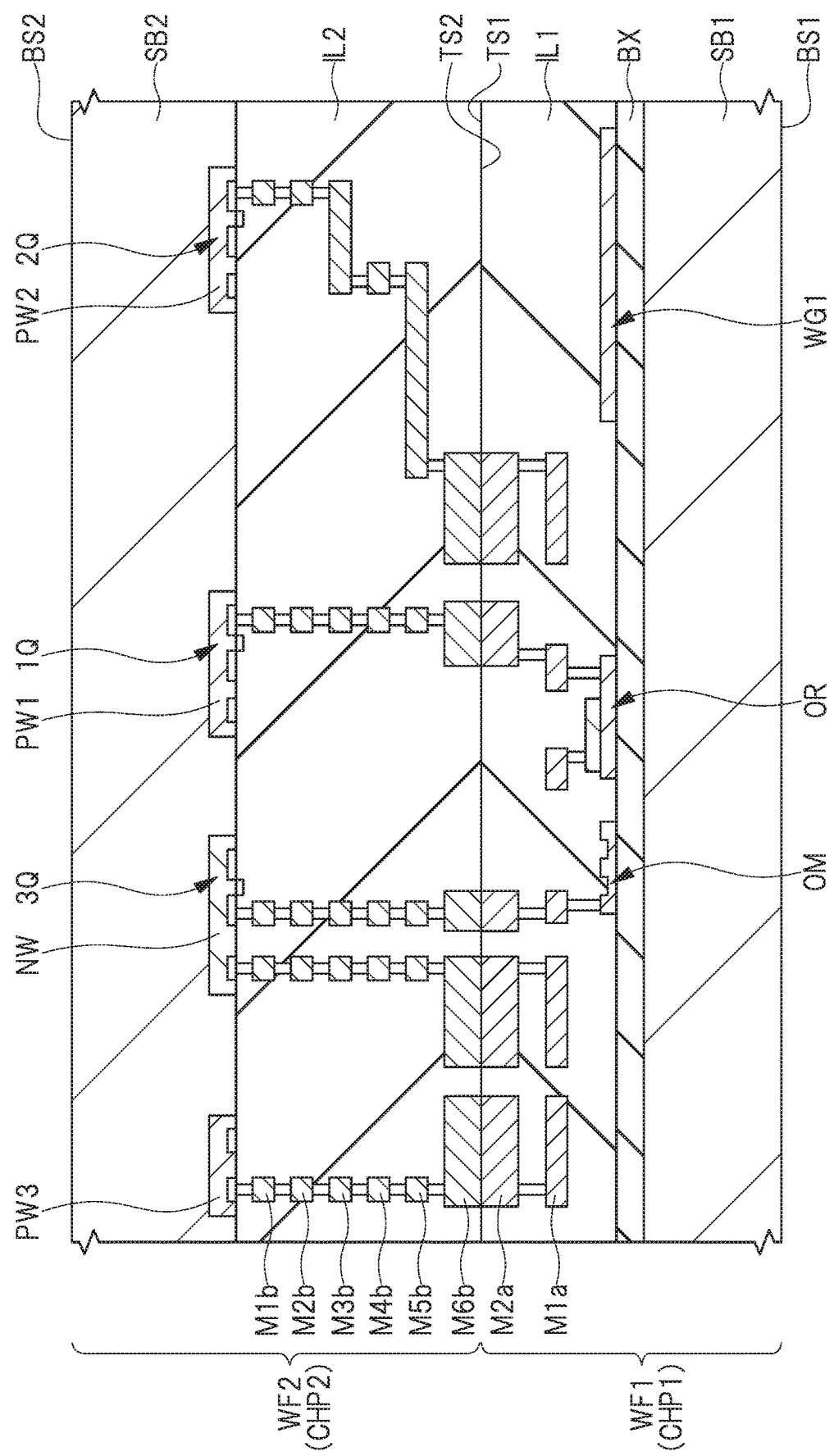
FIG. 4 is a cross-sectional view illustrating a manufacturing step performed after the step in FIG. 3.

Next, as shown in FIG. 4, the top surface TS1 of the wafer WF1 and the top surface TS2 of the wafer WF2 are laminated with each other. At this time, the wafer WF1 and the wafer WF2 are laminated so that the region to be the semiconductor chip CHP1 overlaps the region to be the semiconductor chip CHP2. As a result, the interlayer insulating film IL1 and the wiring M2a of the wafer WF1 are laminated to the interlayer insulating film IL2 and the wiring M6b of the wafer WF2, respectively.

Figure 5:
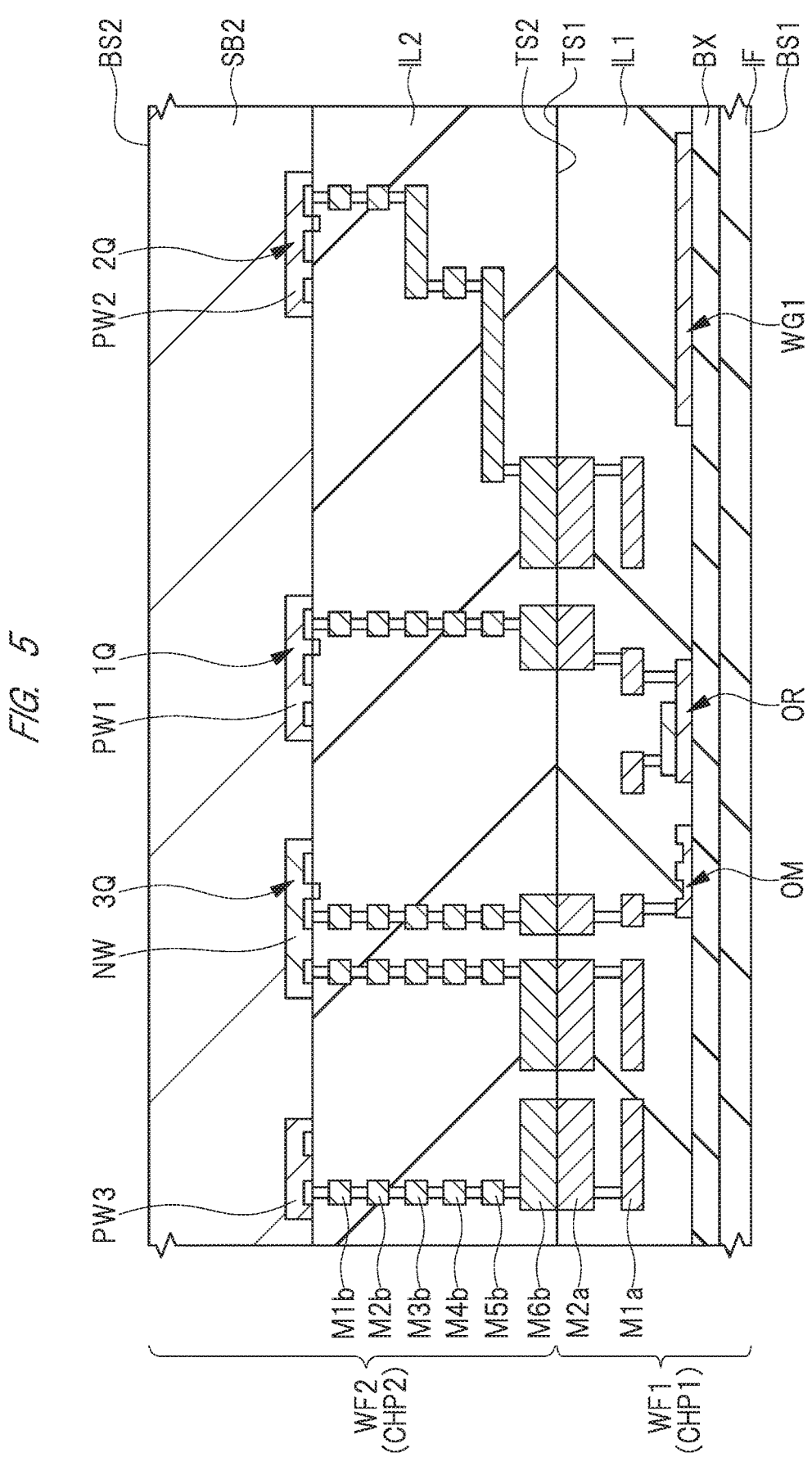
FIG. 5 is a cross-sectional view illustrating a manufacturing step performed after the step in FIG. 4.

Next, as shown in FIG. 5, the back surface BS1 of the wafer WF1 is polished to remove the semiconductor substrate SB1, thereby exposing the insulating film BX on the back surface BS1 side of the wafer WF1.

Next, an insulating film IF comprised of silicon oxide is formed on the lower surface of the insulating film BX by, e.g., CVD. The thickness of the insulating film IF is, for example, 1 µm to 2 µm.

If necessary, before and after these steps, the back surface BS2 of the wafer WF2 may be polished to reduce the thickness of the semiconductor substrate SB2.

Figure 6:
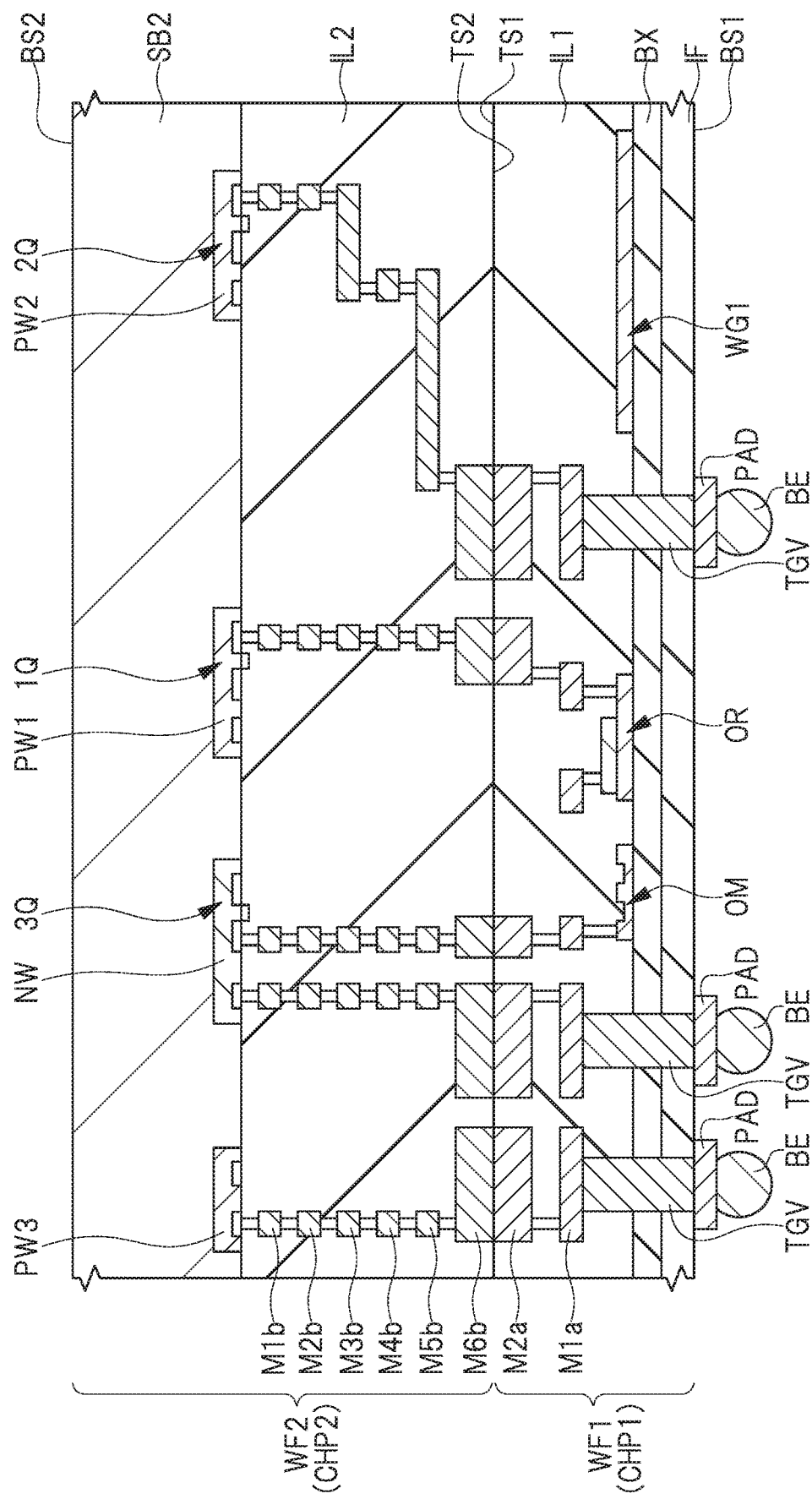
FIG. 6 is a cross-sectional view illustrating a manufacturing step performed after the step in FIG. 5.

Next, as shown in FIG. 6, first, a hole is formed by penetrating the insulating film BX and the insulating film IF so as to reach the wiring M1a from the back surface BS1 side of the wafer WF1, and removing a part of the interlayer insulating film IL1. Next, a conductive film comprised of copper, for example, is buried in the hole. Next, a conductive film including, for example, a copper film or an aluminum film is formed on the lower surface side of the insulating film IF, i.e., the back surface BS1 side of the wafer WF1, and the conductive film is patterned to form a pad electrode PAD. Next, bump electrodes BE formed of, for example, solder balls are formed so as to be in contact with the pad electrodes PAD.

After the manufacturing step of FIG. 6, the wafer WF1 and the wafer WF2 laminated to each other are singulated by dicing, whereby a plurality of semiconductor chips CHP1 and a plurality of semiconductor chips CHP2 laminated with each other as shown in FIG. 2 are obtained. That is, a plurality of semiconductor modules MJ is formed.

As described above, since the dicing step is performed while the wafer WF1 and the wafer WF2 are laminated with each other, the planar size of the semiconductor chip CHP1 and the planar size of the semiconductor chip CHP2 are the same.

Here, a blade or laser technique is used for the dicing step, and according to die study by die inventors of the present application, it has been found that there is some variation in the size of each chip in these techniques. Further, since the thermal expansion coefficients of the insulating films such as the interlayer insulating film IL 1 and the interlayer insulating film IL2 and the silicon such as the semiconductor substrate SB2 differ from each other, the planar sizes of the semiconductor chip CHP1 and the semiconductor chip CHP2 may change after the dicing step.

In particular, when the wafer WF1 and the wafer WF2 laminated with each other are diced collectively as in the present embodiment, the variation in the plane size of one semiconductor module MJ becomes large. Such variations are in the range of 5 µm or less. That is, in the semiconductor module MJ of the present embodiment, as described with reference to FIG. 1, the deviation between the positions of the first side S1 to the fourth side S4 of the semiconductor chip CHP1 and the positions of the first side S1 to the fourth side S4 of the semiconductor chip CHP2 is 5 µm or less, respectively.

A Second Embodiment

Hereinafter, a semiconductor module MJ of the second embodiment will be described with reference to FIG. 7. In the following description, differences from the first embodiment will be mainly described.

Figure 7:
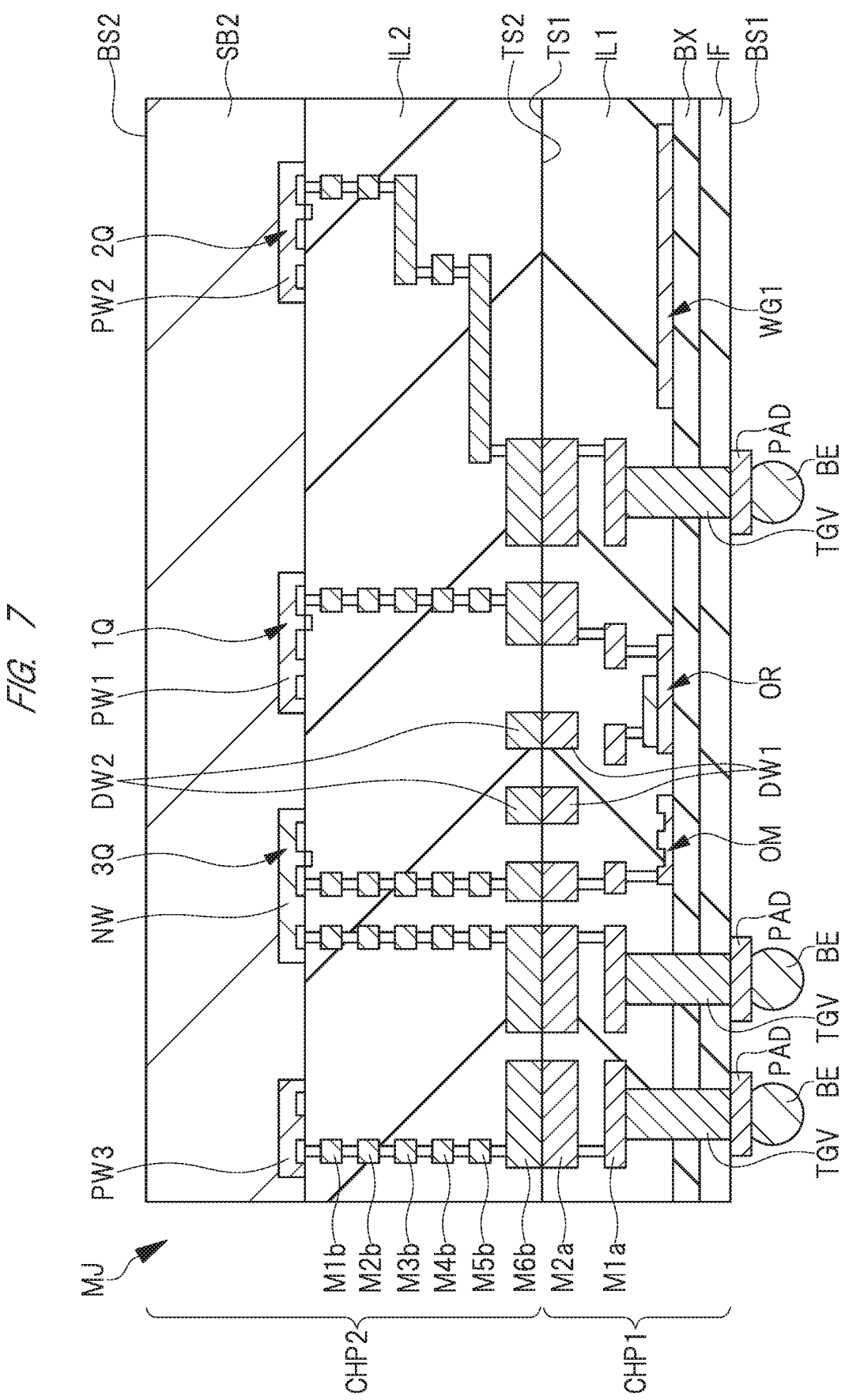
FIG. 7 is a cross-sectional view illustrating a semiconductor module according to the second embodiment.

As shown in FIG. 7, in the second embodiment, a portion of the wiring M2a, which is the uppermost layer wiring of the semiconductor chip CHP1, is formed as a dummy wiring DW1, and a portion of the wiring M6b, which is the uppermost layer wiring of the semiconductor chip CHP2, is formed as a dummy wiring DW2.

The dummy wirings DW1 and DW2 are wirings that are not electrically connected with the optical devices of the semiconductor chip CHP1 (such as the optical waveguide WG1, the optical modulator OM, and the optical receiver OR) and the semiconductor elements such as MISFET1Q to 3Q of the semiconductor chip CHP1, and are floating wirings.

The purpose of providing the dummy wiring DW1 and the dummy wiring DW2 is mainly to prevent dishing due to a polishing step when forming the wiring M2a and the wiring M6b. That is, in the wiring layer of the same layer as the wiring M2a or the wiring M6b, if the interval between adjacent wirings becomes large, a problem of dishing tends to occur. Therefore, dishing can be prevented by providing the dummy wiring DW1 and the dummy wiring DW2 in such a wide space region.

In the second embodiment, the dummy wiring DW1 of the semiconductor chip CHP1 and the dummy wiring DW2 of the semiconductor chip CHP2 are arranged so as to be laminated with each other. The wiring M2a including the dummy wiring DW1 and the dummy wiring DW2 and the wiring M6b are formed of a conductive film mainly made of copper. When copper is in direct contact with the interlayer insulating film IL1 or the interlayer insulating film IL2, it tends to easily diffuse into the interlayer insulating film IL1 or the interlayer insulating film IL2. Wiring M2a and wiring M6b, which are damascene structures, are surrounded by a barrier metal film on their sides and bottom, but no barrier metal film is formed on their upper surface. Therefore, by forming the dummy wiring DW1 and the dummy wiring DW2 face each other, it is possible to suppress copper included in the dummy wiring DW1 and the dummy wiring DW2 from being diffused into the interlayer insulating film IL1 or the interlayer insulating film IL2 as much as possible.

That is, for the purpose of only suppressing dishing, it is not necessary to laminate the dummy wiring DW1 and the dummy wiring DW2 with each other. However, considering the diffusion of copper into the interlayer insulating film IL1 or the interlayer insulating film IL2, the reliability of the entire semiconductor module MJ can be improved by laminating the dummy wiring DW1 and the dummy wiring DW2 with each other.

Further, by laminating the dummy wiring DW1 and the dummy wiring DW2, which are metal films, with each other, it is possible to obtain a greater laminating strength than by laminating the interlayer insulating film IL1 and the interlayer insulating film IL2 with each other. That is, the laminating strength between the semiconductor chip CHP1 and the semiconductor chip CHP2 can be improved.

A Third Embodiment

Hereinafter, a semiconductor module MJ and a manufacturing method thereof according to a third embodiment will be described with reference to FIGS. 8 to 13. In the following description, differences from the first embodiment will be mainly described.

Figure 8:
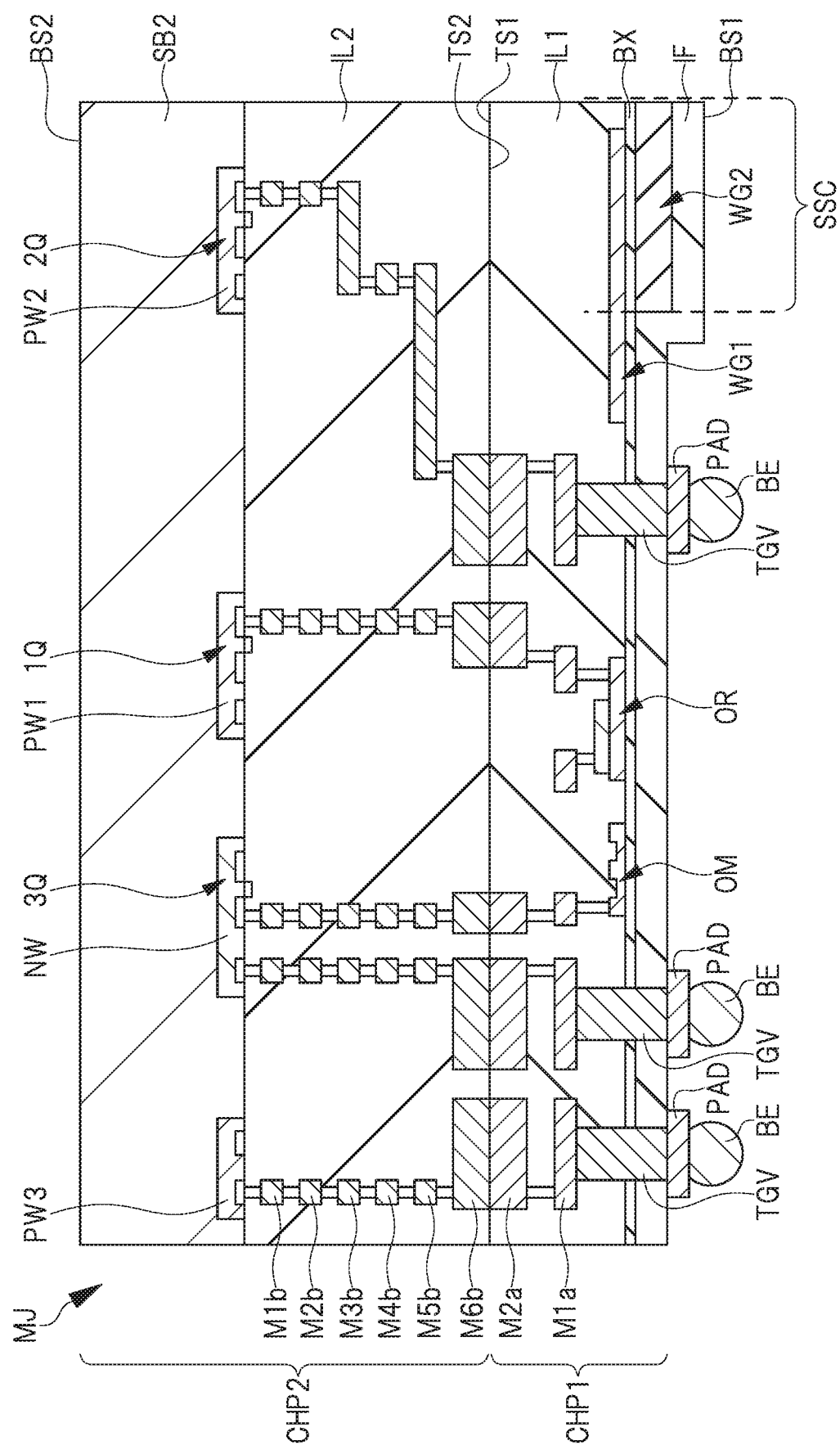
FIG. 8 is a cross-sectional view illustrating a semiconductor module according to a third embodiment.

As shown in FIG. 8, in the third embodiment, a spot size converter SSC is provided in the vicinity of the side surface of the semiconductor chip CHP1 that receives the laser beam LZ from the laser diode chip LD.

(Spot Size Converter SSC)

The difference between the spot size of the light propagating through the optical waveguide WG1 and the spot size of the light emitting device such as the laser light LZ may be problematic in connecting the semiconductor chip CHP1, which is a photonic chip, and the laser diode chip LD. For example, if the optical waveguide WG1 and the light emitting element having spot sizes different from each other are optically connected as they are, there arises a problem that the optical loss in the connection portion becomes increase. In addition, almost the same problem, occurs in connection between the optical waveguide WG1 and an optical fiber or the like.

For example, the spot size of the light propagating through the optical waveguide WG1 is on the order of submicron, while the spot size of the light in the optical fiber or the light emitting element is on the order of several microns. Therefore, it is effective to insert a spot size converter SSC as an optical device that converts the spot size of light between the optical waveguide WG1 that propagates light having a relatively small spot size and an optical fiber or light emitting element that propagates light having a relatively large spot size.

Therefore, as shown in FIG. 8, in the third embodiment, as the spot size converter SSC, in addition to a part of the optical waveguide WG1, the optical waveguide WG2 is further provided below the optical waveguide WG1. The optical waveguide WG2 is formed between the insulating film BX and the insulating film IF1, and is formed of an insulating film comprised of, for example, silicon nitride. The thickness of the optical waveguide WG2 is, for example, 1 µm to 2 µm. Here, the optical waveguide WG2 is a path through which light propagates, and functions as a core layer. The lower surface of the insulating film BX and the lower surface of the optical waveguide WG2 are covered with an insulating film IF comprised of a material having a refractive index lower than that of the material constituting the optical waveguide WG2. Therefore, the insulating film IF functions as a cladding layer. One side surface of the optical waveguide WG2 is not covered with the insulating film IF and is exposed. That is, in the fourth side S4 of the semiconductor chip CHP2, one side surface of the optical waveguide WG2 is exposed, and the laser light LZ can be directly received from the laser diode chip LD.

Figure 9:
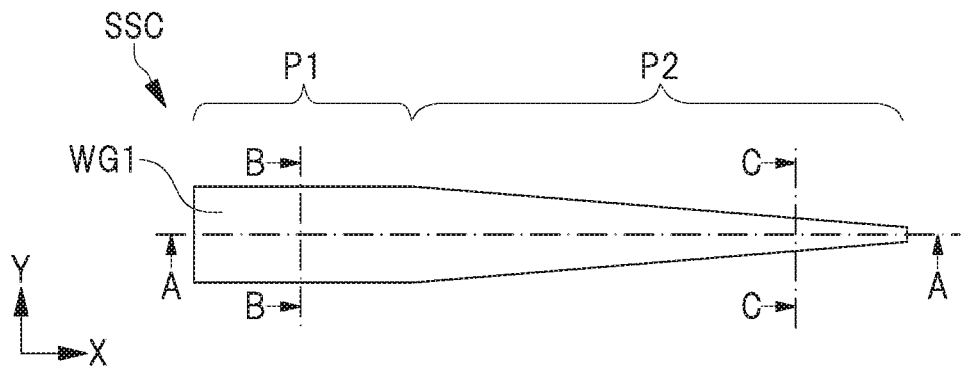
FIG. 9 is a principal part plan view illustrating a semiconductor module according to the third embodiment.
Figure 10:
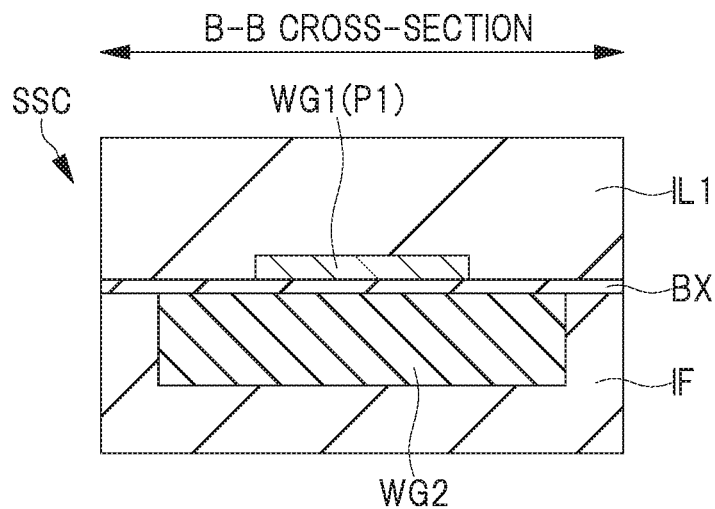
FIG. 10 is a principal part sectional view illustrating a semiconductor module according to the third embodiment.
Figure 11:
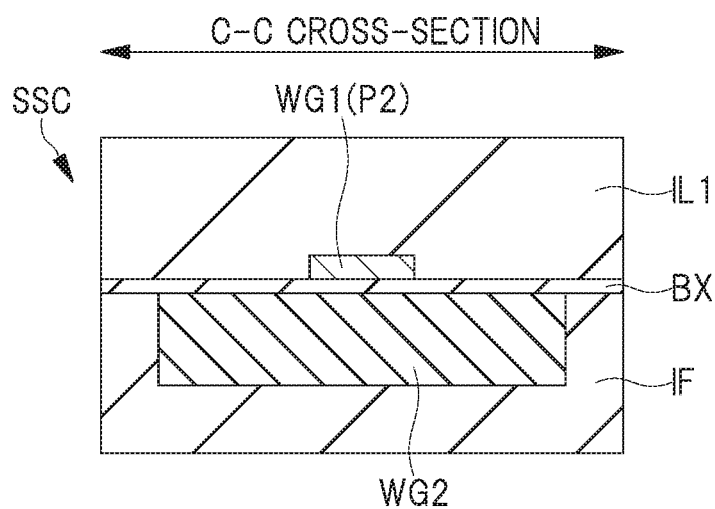
FIG. 11 is a principal part sectional view illustrating a semiconductor module according to the third embodiment.

FIG. 9 illustrates an enlarged plan view of a main portion of the optical waveguide WG2 constituting a portion of the spot size converter SSC, and FIGS. 10 and 11 illustrate cross-sectional views along the line B-B and the line C-C of FIG. 9, respectively. The cross-sectional view along the line A-A in FIG. 9 corresponds to the spot size converter SSC shown in FIG. 8.

As shown in FIGS. 9 to 11, the optical waveguide WG1 has a portion P1 and a portion P2 along the extending direction (X direction) of the optical waveguide WG1. In plan view, the portion P1 of the optical waveguide WG1 has substantially the same width in the direction (Y direction) orthogonal to the extending direction (X direction) of the optical waveguide WG1, and the portion P2 of the optical waveguide WG1 has a tapered shape such that the width in the Y direction is continuously narrowed.

In the third embodiment, the thickness of the insulating film BX is smaller than that of the first embodiment, for example, 30 nm to 400 nm. That is, the distance between the optical waveguide WG1 and the optical waveguide WG2 is, for example, 30 nm to 400 nm.

Here, the optical waveguides WG1 and WG2 respectively receive the laser light LZ from the laser diode chip LD. Here, since the insulating film BX exists between the optical waveguide WG1 and the optical waveguide WG2, the laser light LZ propagating in the optical waveguide WG2 does not appear to propagate into the optical waveguide WG1. For example, in the first embodiment, the insulating film BX formed under the optical waveguide WG1 functions as a cladding layer.

However, in the third embodiment, the thickness of the insulating film BX is reduced so as to be smaller than the seepage distance of the evanescent light. That is, the distance between the optical waveguide WG1 and the optical waveguide WG2 is, for example, 30 nm to 400 nm, which is smaller than the seepage distance of the evanescent light. Therefore, the evanescent light allows the laser light LZ in the optical waveguide WG2 to propagate from the optical waveguide WG2 to the optical waveguide WG1.

Therefore, as the laser light LZ received by the optical waveguide WG2 propagates inside the optical waveguide WG2, the distribution of the laser light LZ moves from the optical waveguide WG2 to the optical waveguide WG1 via the portion P2 which is the tapered portion of the optical waveguide WG1 adjacent to the optical waveguide WG2. The movement of the distribution of the laser light LZ depends on the shape of the portion P2 which is a tapered portion. As described above, even if the spot size of the light propagating through the optical waveguide WG1 and the spot size of the light such as the laser diode chip LD are different from each other, the light loss can be suppressed by the spot size converter SSC.

(Manufacturing Process of Spot Size Converter SSC)

Figure 12:
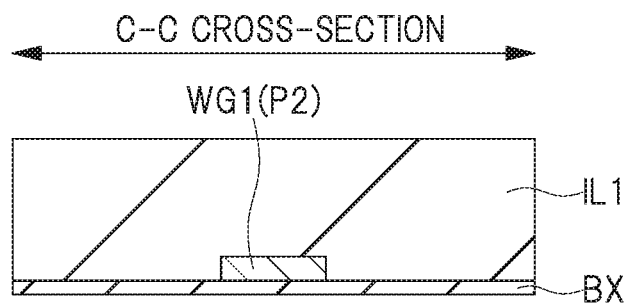
FIG. 12 is a principal part sectional view illustrating a manufacturing step of a semiconductor module according to the third embodiment.
Figure 13:
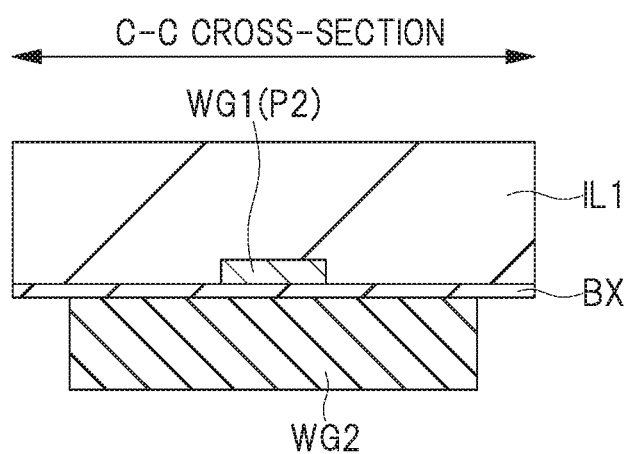
FIG. 13 is a main portion sectional view illustrating a manufacturing step performed after the step in FIG. 12.

Hereinafter, a manufacturing process of the spot size converter SSC, which is a part of the semiconductor module MJ of the third embodiment, will be described with reference to FIGS. 12 and 13. FIGS. 12 and 13 are cross-sectional views taken along line C-C of FIG. 9, and correspond to the step from the polishing step of the semiconductor substrate SB1 to the forming step of the insulating film IF described in FIG. 5 of the first embodiment.

First, as shown in FIG. 12, similarly to the step described in FIG. 5 of the first embodiment, the insulating film BX is exposed by performing a polishing step on the semiconductor substrate SB1 and further adding a dry etching process. Here, the thickness of the insulating film BX is, for example, 500 nm to 3 µm. Next, polishing is continued and wet etching is further performed to reduce the thickness of the insulating film BX. By this step, the thickness of the insulating film BX becomes, for example, about 30 nm to 400 nm.

Next, as shown in FIG. 13, an insulating film comprised of, e.g., silicon nitride is formed on the lower surface of the insulating film BX by, e.g., CVD. The thickness of the insulating film is, for example, 1 µm to 2 µm. Next, the insulating film is patterned by a photolithography method and an etching process to form the optical waveguide WG2.

Thereafter, similarly to the step described with reference to FIG. 5 of the first embodiment, the insulating film IF is formed, whereby the structure of FIG. 11 is obtained. In the third embodiment, the insulating film IF is formed so as to cover not only the insulating film BX but also the optical waveguide WG2.

Here, it is conceivable to form a device similar to the spot size converter SSC of the third embodiment by forming the optical waveguide WG2 on the optical waveguide WG1, but in this case, various dry etching processes and the like are required to form the optical waveguide WG2 on the semiconductor layer constituting the optical waveguide WG1. As a result, there is a fear that the optical waveguide WG1 may be damaged by etching, or a charge-up may occur in the optical waveguide WG1. In particular, since the thickness of the optical waveguide WG2 of the third embodiment is, for example, 1 µm to 2 µm, it is necessary to perform the dry etching step by over-etching for a long time, and in this case, it is easy to increase the possibility that the above-mentioned etching damage and the above-mentioned charge-up will occur.

On the other hand, in the third embodiment, the optical waveguide WG2 can be formed below the optical waveguide WG1 by using the back surface BS1 of the semiconductor chip CHP1. Therefore, it is possible to suppress the possibility of causing the above-mentioned trouble to the optical waveguide WG1, and therefore, it is possible to improve the performance of the spot size converter SSC.

The technique of the third embodiment can also be applied in combination with the second embodiment described above.

(A First Modification)

Hereinafter, the semiconductor module MJ of a first modification and manufacturing method thereof will be described with reference to FIGS. 14 to 18. In the following description, differences from the third embodiment will be mainly described.

Figure 14:
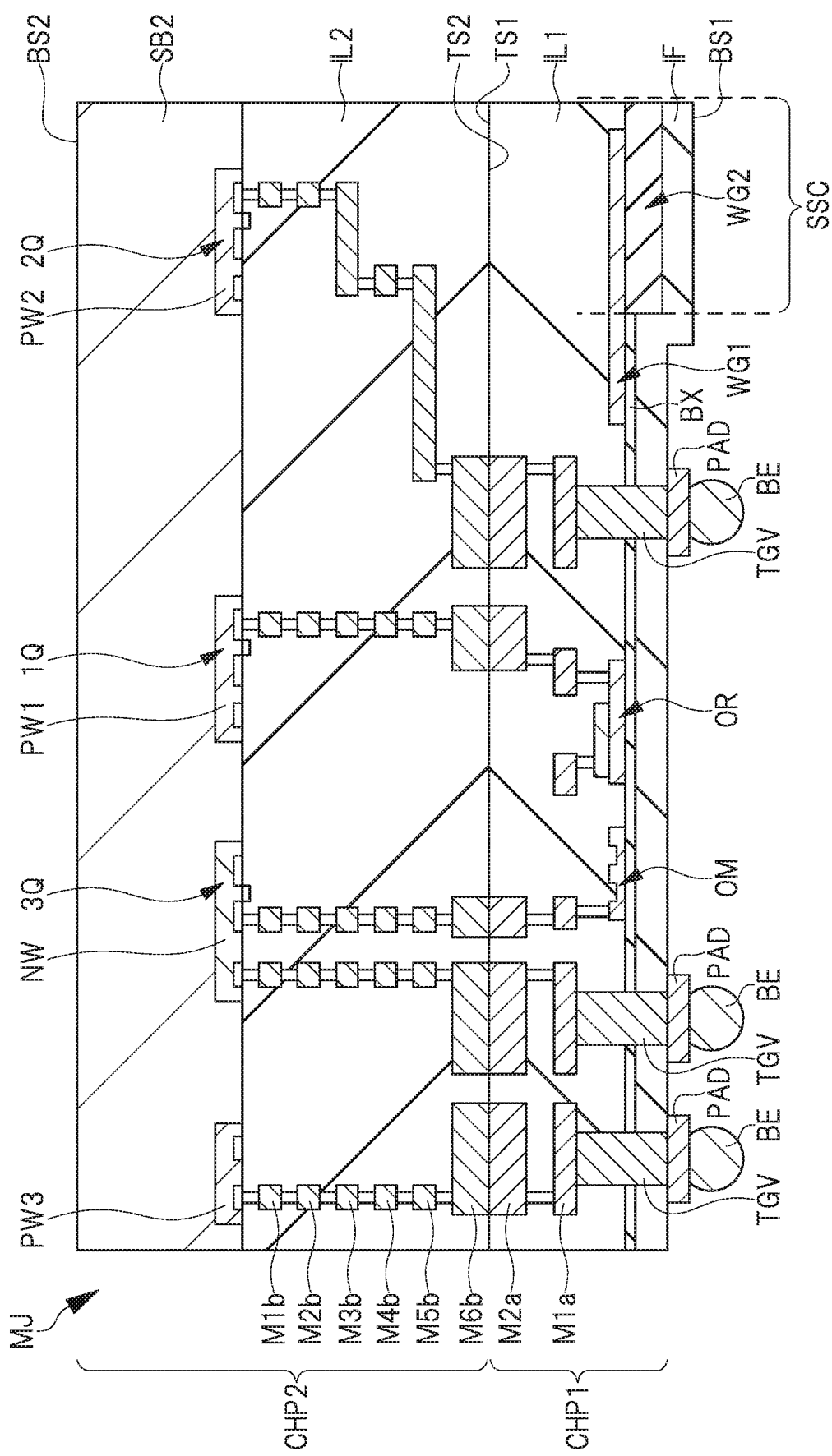
FIG. 14 is a sectional view illustrating a semiconductor module according to a first modification.

As shown in FIG. 14, in the first modification, a spot size converter SSC is provided for the same purpose as in the third embodiment. However, in the first modification, unlike the third embodiment, the insulating film BX is removed between the optical waveguide WG1 and the optical waveguide WG2 constituting the spot size converter SSC, and the optical waveguide WG2 is in direct contact with the optical waveguide WG1.

Figure 15:
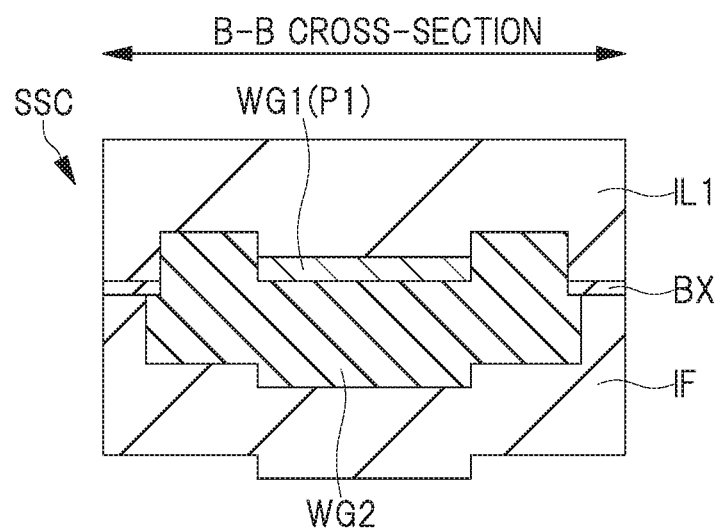
FIG. 15 is a main portion sectional view illustrating a semiconductor module according to the first modification.
Figure 16:
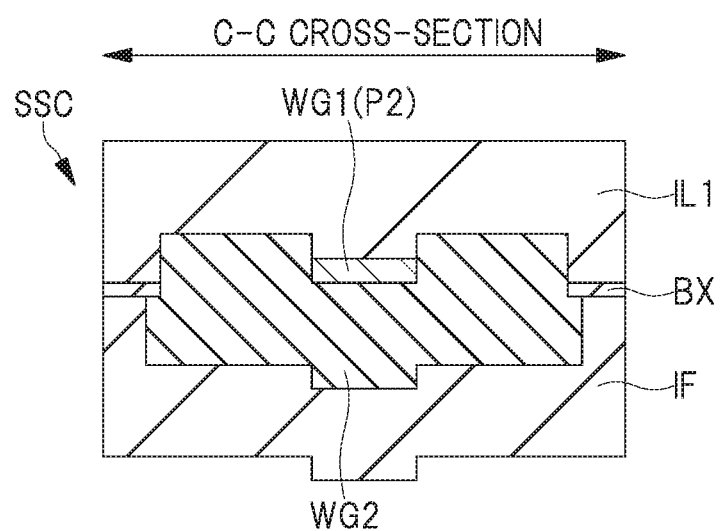
FIG. 16 is a main portion sectional view illustrating a semiconductor module according to the first modification.

The plan view of the optical waveguide WG1 constituting a portion of the spot size converter SSC is the same as that of FIG. 9 explained in the third embodiment, and the cross-sectional view along the line A-A of FIG. 9 corresponds to the spot size converter SSC shown in FIG. 14. FIGS. 15 and 16 show cross-sectional view taken along line B-B and line C-C of FIG. 9, respectively.

As shown in FIGS. 15 and 16, the insulating film such as a silicon nitride film which is the optical waveguide WG2 cove not only the lower surface of the optical waveguide WG1 but also the side surface (side surface along the X direction) of the optical waveguide WG1. The lower surface of the optical waveguide WG2 is covered with an insulating film IF.

In the third embodiment, since the optical waveguide WG2 is in direct contact with the optical waveguide WG1, the laser light LZ propagating in the optical waveguide WG2 can easily propagate from the optical waveguide WG2 to the optical waveguide WG1 without using evanescent light as in the third embodiment.

The optical waveguide WG2 is not only in direct contact with the optical waveguide WG1, but also covers the lower surface and the side surface of the optical waveguide WG1. Therefore, even if there is light leaking from the optical waveguide WG1, the leaked light can be absorbed by the optical waveguide WG2. In other words, optical loss can be suppressed.

In the first modification, the position of the upper surface of the optical waveguide WG2 reaches a position higher than the position of the upper surface of the optical waveguide WG1, but the position of the upper surface of the optical waveguide WG2 may be lower than the position of the upper surface of the optical waveguide WG1. In addition, the position of the upper surface of the optical waveguide WG2 may be the same as the position of the lower surface of the optical waveguide WG1 only for the purpose of forming the optical waveguide WG2 directly contact the optical waveguide WG1. That is, the position of the upper surface of the optical waveguide WG2 is the same as the position of the lower surface of the optical waveguide WG1 or higher than the position of the lower surface of the optical waveguide WG1.

(Manufacturing Process of Spot Size Converter SSC)

Figure 17:
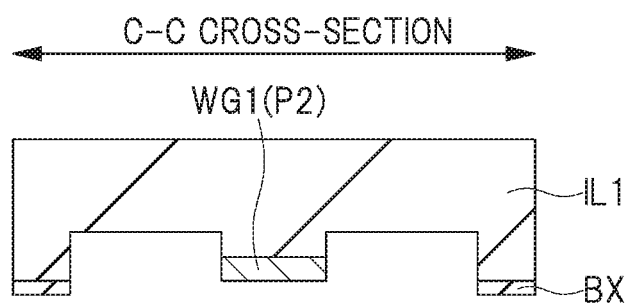
FIG. 17 is a cross-sectional view of a main portion illustrating a manufacturing step of the semiconductor module of the first modification.
Figure 18:
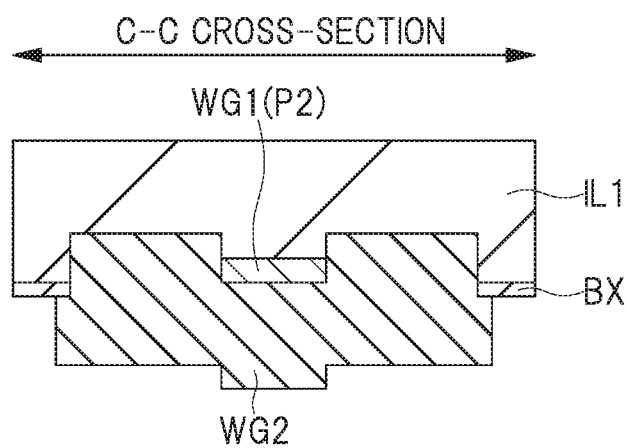
FIG. 18 is a main portion sectional view illustrating a manufacturing step.

Hereinafter, a manufacturing process of the spot size converter SSC, which is a part of the semiconductor module MJ of the first modification, will be described with reference to FIGS. 17 and 18. FIGS. 17 and 18 are cross-sectional view taken along line C-C of FIG. 9, and correspond to the steps described in FIGS. 12 and 13 of the third embodiment.

First, as shown in FIG. 17, similarly to the method described with reference to FIG. 5 of the first embodiment, the insulating film BX is exposed by performing the polishing step on the semiconductor substrate SB1. Next, the insulating film BX in the region to be the spot size converter SSC is selectively removed by a photolithography method and an etching step. Then, the etching step is further continued to remove a portion of the interlayer insulating film IL1.

Next, as shown in FIG. 18, an insulating film comprised of, silicon nitride is formed on the lower surface of the insulating film EX by, e.g., CVD. The thickness of the insulating film is, for example, 1 μm to 2 μm. Next, the insulating film is patterned by a photolithography method and an etching step to form an optical waveguide WG2.

Thereafter, similarly to the method described with reference to FIG. 5 of the first embodiment, the insulating film IF is formed, whereby the structure of FIG. 16 is obtained. In the first modification, the insulating film IF is formed so as to cover not only the insulating film BX but also the optical waveguide WG2.

A Fourth Embodiment

The semiconductor module MJ according to a fourth embodiment and the method for manufacturing the same will be described below with reference to FIGS. 19 to 21. In the following description, differences from the first modification will be mainly described.

Figure 19:
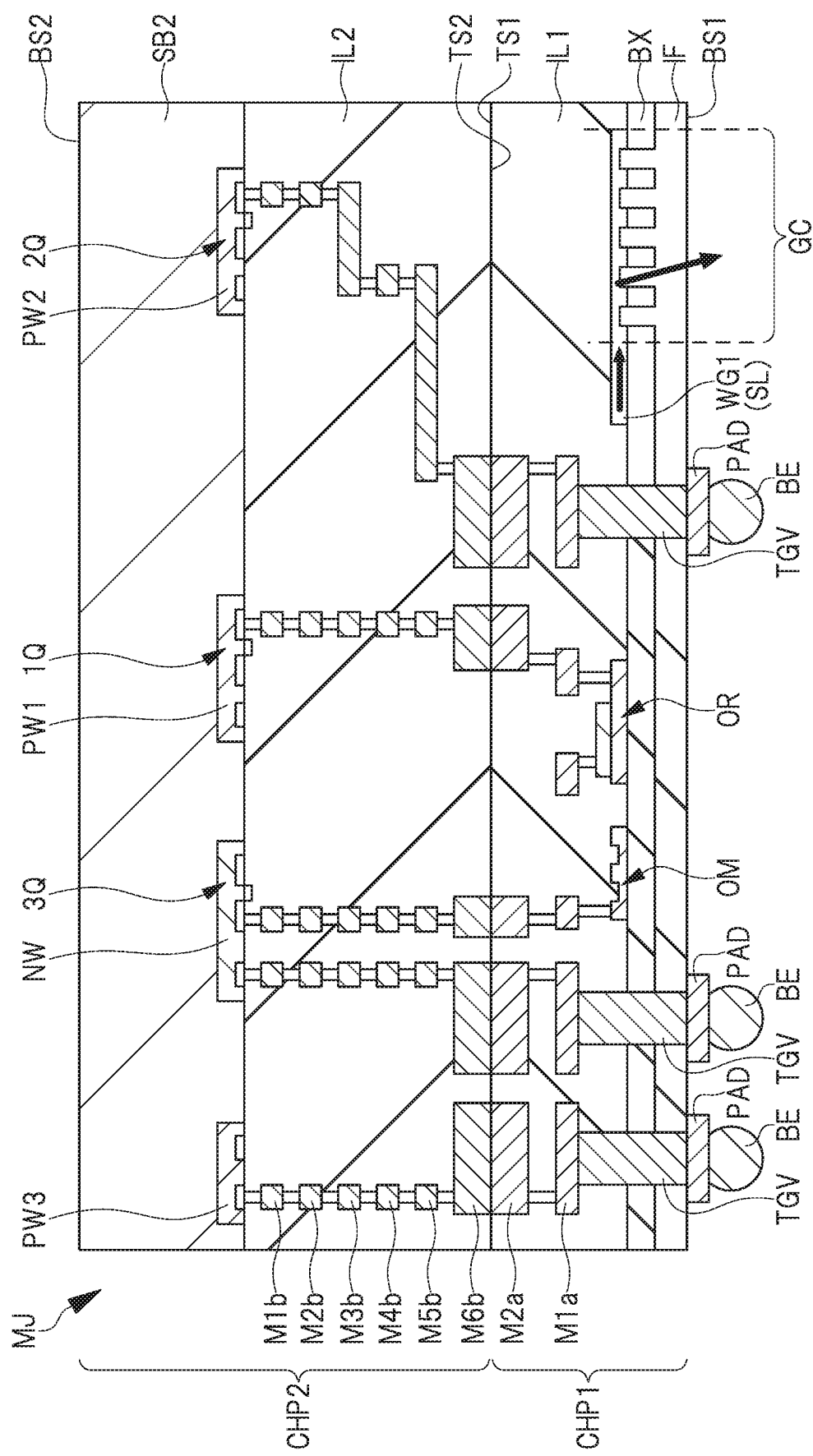
FIG. 19 is a cross-sectional view illustrating a semiconductor module according to the fourth embodiment.

As shown in FIG. 19, in the fourth embodiment, a grating coupler (Grating Coupler) GC connected with the optical waveguide WG1 is provided in the semiconductor chip CHP1. The grating coupler GC is formed by processing the same semiconductor layer as the optical waveguide WG1, the optical modulator ON, the optical receiver OR, and the like. In the fourth embodiment, for convenience, the semiconductor layer is described as a semiconductor layer SL.

(Grating Coupler)

The grating coupler GC is one type of the optical waveguide WG1, and is an optical device that couples laser light incident an optical communication device external with the semiconductor module MJ to light propagating through the optical waveguide WG1, or emits light propagating through the optical waveguide WG1 to an optical communication device external with the semiconductor module MJ.

In FIG. 19, a light propagation path is schematically indicated by an arrow when light is emitted from the optical waveguide WG1 to an optical communication device external with the semiconductor module MJ via the grating coupler GC. When light enters the optical waveguide WG1 from an optical communication device external with the semiconductor module MJ via the grating coupler GC, the direction of the arrow is reversed. In FIG. 19, hatching around the grating coupler GC and the optical waveguide WG1 is omitted in order to make the propagation path of light easier to understand.

The light propagating through the grating coupler GC is subjected to periodic refractive index modulation (waveguide grating) by concave portion (groove portion) and a convex portion (projection portion) provided on the optical waveguide surface along the propagation direction, and is diffracted and radiated in a specific direction. In the fourth embodiment, as shown in FIG. 19, the concave portion and the convex portion comprised of the grating coupler GC are provided toward the back surface BS1 of the semiconductor chip CHP1. Therefore, the diffraction direction of the light is dominated by the direction toward the back surface BS1 side.

In the fourth embodiment, the semiconductor chip CHP2 is provided on the top surface TS1 side of the semiconductor chip CHP1. Therefore, it is difficult to perform the optical communication between the grating coupler GC and the optical communication device external with the semiconductor module MJ on the top surface TS1 side, and it is effective to perform the optical communication on the back surface BS1 side. Here, below the grating coupler GC, the semiconductor substrate SB1 is removed from the back surface BS1 of the semiconductor chip CHP1, and the insulating film IF is exposed. Therefore, the grating coupler GC can perform optical communication with an optical communication device external with the semiconductor module MJ on the back surface BS1 side. As described above, since the concave portion and the convex portion of the grating coupler GC are provided toward the back surface BS1 side, the light can be efficiently propagated.

(Manufacturing Process of Grating Coupler)

Hereinafter, a manufacturing process of the grating coupler GC which is a part of the semiconductor module MJ of the first modification will be described with reference to FIGS. 20 and 21. FIGS. 20 and 21 show cross-sectional views of main portions in which the formation region of the grating coupler GC is enlarged, and corresponds to the process from the polishing step of the semiconductor substrate 511 to the formation step of the insulating film IF described with reference to FIG. 5 of the first embodiment.

Figure 20:
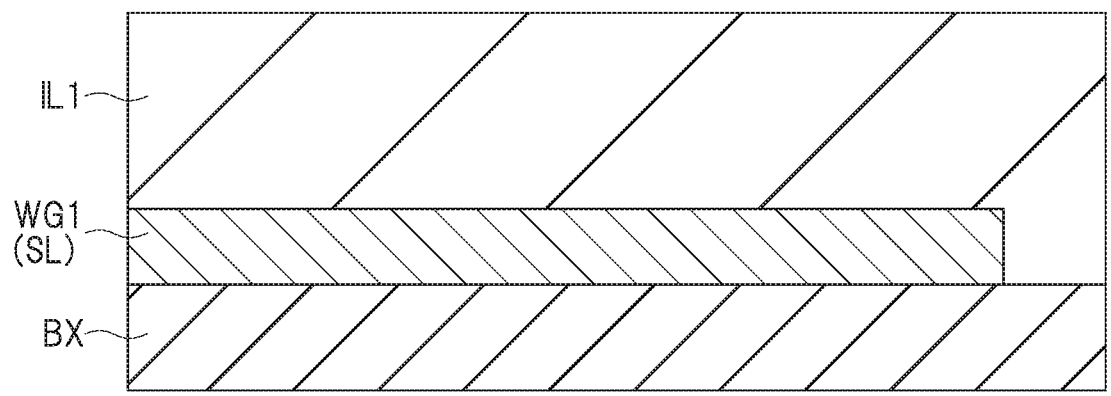
FIG. 20 is a main portion sectional view illustrating a manufacturing step of a semiconductor module according to the fourth embodiment.

First, as shown in FIG. 20, similarly to the method described with reference to FIG. 5 of the first embodiment, the insulating film BX is exposed by performing the polishing step on the semiconductor substrate SB1.

Figure 21:
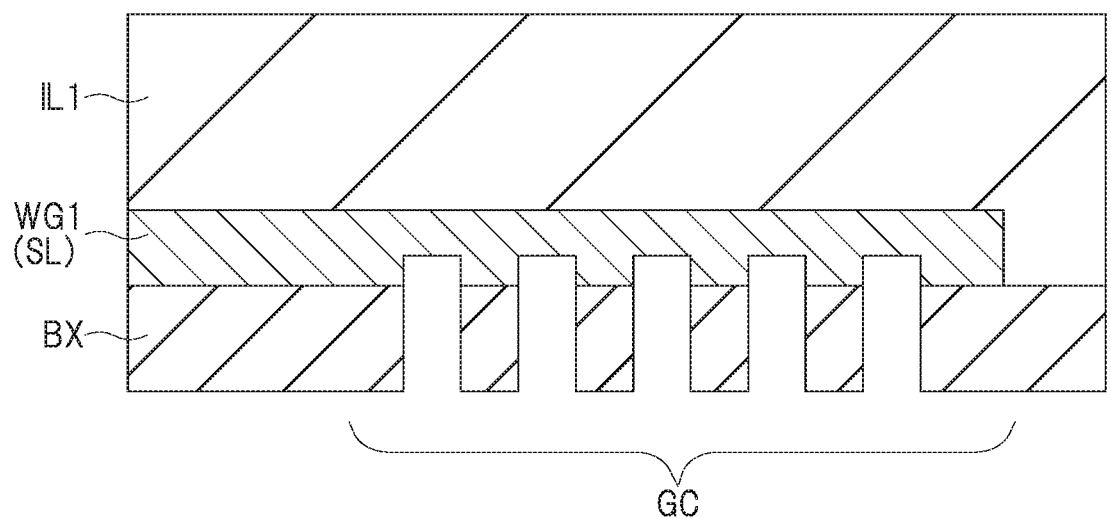
FIG. 21 is a main portion sectional view illustrating a manufacturing step.

Next, as shown in FIG. 21, a portion of the insulating film BX is selectively patterned by photolithography and etching. Thereafter, the etching gas is changed and the etching step is continued to form recesses (grooves) in the semiconductor layer SL so as not to penetrate the semiconductor layer SL. At this time, a region which is not etched becomes a convex portion. In this manner, the semiconductor layers SL are processed to form grating couplers GC having concave portions and convex portions provided toward the back surface BS1 of the semiconductor chips CHP1.

Thereafter, similarly to the method described with reference to FIG. 5 of the first embodiment, the insulating film IF is formed, whereby the structure of FIG. 16 is obtained. The insulating film IF is formed so as to cover the concave portion and the convex portion of the grating coupler GC.

The technique of Embodiment 4 can also be applied in combination with the second and third embodiments described above.

(A second Modification)

Hereinafter, the semiconductor module MJ of a second modification will be described with reference to FIG. 22. In the following description, differences from the fourth embodiment will be mainly described.

Figure 22:
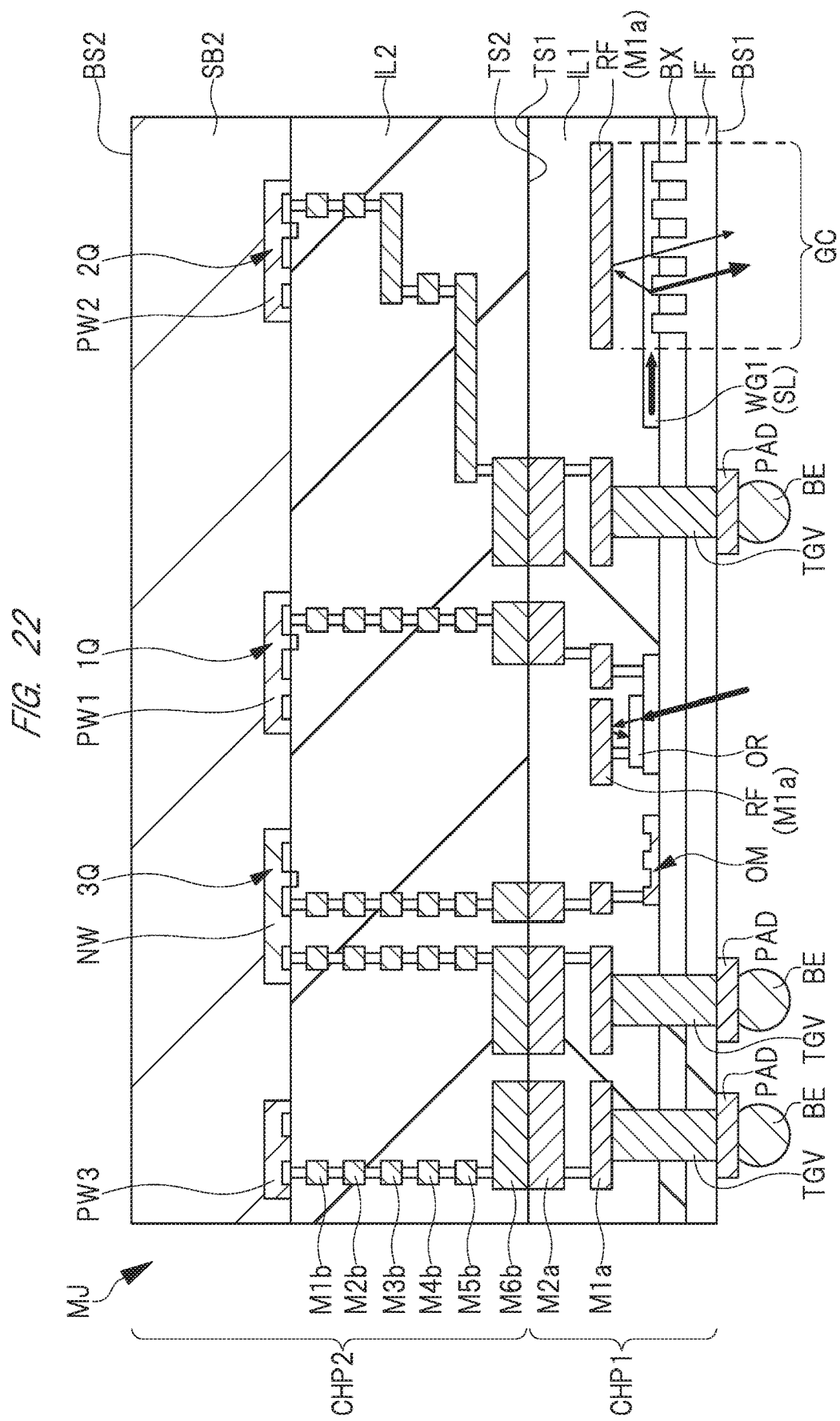
FIG. 22 is a cross-sectional view illustrating a semiconductor module according to a second modification.

As shown in FIG. 22, in the second modification, a grating coupler GC is provided for the same purpose as in the fourth embodiment. In the second modification, the reflective film RF is provided over the grating coupler GC. In other words, the reflection film RF is provided at a position overlapping with the grating coupler GC in plan view.

As described in the fourth embodiment, since the concave portion and the convex portion of the grating coupler GC are provided toward the back surface BS1 side of the semiconductor chip CHP1, the diffractive direction of the light is dominated by the direction toward the back surface 1 side of the semiconductor chip CHP1. However, there is also light which is not diffracted on the back surface BS1 side of the semiconductor chip CHP1 but diffracted on the top surface TS1 side of the semiconductor chip CHP1. Specifically, about 70% of the light is diffracted on the back surface BS1 side, and about 30% of the light is diffracted on the top surface TS1 side. The light diffracted on the top surface TS1 side directly leads to light loss.

The reflection film RF is provided to reflect the light diffracted on the top surface TS1 side to the back surface PSI side to suppress the light loss. Therefore, it is preferable that the reflective film RE covers the entire upper surface of the grating coupler GC.

The reflective film RE is formed of a conductive film, but it is preferable that the reflective film RF is formed of a metal film in order to increase the reflectance of light. FIG. 22 illustrates a case where the reflective film RF is formed of the same material as the wiring M1a, is formed in the same layer as the wiring M1a, and is formed in the same process as the wiring M1a. In this case, the manufacturing process can be simplified. The reflective film RF may be formed of the same material as the wiring M2a, formed in the same layer as the wiring M2a, and formed in the same process as the wiring M2a. As for the selection of the wiring M1a or the wiring M2a, a more appropriate one can be selected depending on the wavelength of the light propagating in the grating coupler GC.

The reflective film RF may be formed of a conductive film different from the wiring M1a or the wiring M2a. Such a conductive film is formed by a process separate from the wiring M1a or the wiring M2a. In this case, although the manufacturing cost for separately forming the reflective film RE increases, the material of the reflective film RF is not limited to the material used for the wiring M1a or the wiring M2a, and can be freely selected so as to obtain a desired reflectance. Examples of such a conductive film include a metal film such as a titanium nitride film, a tantalum nitride film, or a tungsten film.

In the second modification, as shown in FIG. 22, the reflection film RF is also provided over the optical receiver OR. In other words, the reflection film RF is provided at a position overlapping with the optical receiver OR in plan view. As described in the first embodiment, since the semiconductor substrate SB1 is removed from the back surface BS1 of the semiconductor chip CHP1, the optical receiver OR can receive light from an optical communication device external with the semiconductor module MJ on the back surface BS1. At this time, since the reflection film RF is provided over the optical receiver OR, the light transmitted through the optical receiver OR is reflected, and the reflected light can be received by the optical receiver OR. In FIG. 22, hatching around the optical receiver OR is also omitted, as in the periphery of the grating coupler GC, in order to make the propagation path of light easier to understand.

Further, on the back surface BS1 side, it is preferable that the angle of the light incident from the optical communication device external with the semiconductor module MJ to the semiconductor chip CHP1 (the optical receiver OR and the grating coupler GC) is not perpendicular to the reflection film RF, but inclined obliquely from the normal to the reflection film RF. The reason for this is that, when the incident angle is perpendicular, the incident light and the light reflected from the reflective film RF overlap with each other, and there is a possibility that the wavelengths of the incident light and the light cancel each other out.

Although the invention made by the inventors of the present application has been specifically described based on the embodiments, the present invention is not limited to the above-described embodiments, and various modifications can be made without departing from the gist thereof.

For example, in the semiconductor chip CHP1, a wiring lower than the uppermost wiring such as the wiring M1a may be a wiring formed by stacking a titanium nitride film, an aluminium film, and a titanium nitride film and patterning the stacked film, instead of a wiring having a damascene structure. In this case, after forming the wiring and forming the interlayer insulating film so as to cover the wiring, the interlayer insulating film is flattened by performing a polishing step on the upper surface of the interlayer insulating film by the CMP method.

Further, in the semiconductor chip CHP1, although a two-layer wiring of the wiring M1a and the wiring M2a is exemplified as the multilayer wiring, the multilayer wiring of the semiconductor chip CHP1 may be three or more layers. In the semiconductor chip CHP2, the six-layer wirings of the wirings M1b to M6b are exemplified as the multilayer wirings, but the multilayer wirings of the semiconductor chip CHP2 may be smaller than six layers or larger than six layers.

In addition, some of the contents described in the above embodiments will be described below.

[Appendix 1]

A semiconductor module comprising:
a first semiconductor chip comprising an optical device, a first wiring formed over the optical device and electrically connected with the optical device, and a first dummy wiring formed in the same layer as the first wiring and not electrically connected with the optical device; and
a second semiconductor chip comprising a semiconductor element constituting a part of an electric circuit, a second wiring formed over the semiconductor element and electrically connected with the semiconductor element, and a second dummy wiring formed in the same layer as the second wiring and not electrically connected with the semiconductor element,
wherein the second semiconductor chip is mounted on the first semiconductor chip, and
wherein a top surface of the first semiconductor chip is laminated with a top surface of the second semiconductor chip such that the first and second wirings are directly contacted with each other and such that the first and second dummy wirings are directly contacted with each other.

[Appendix 2]

A semiconductor module comprising:
a first semiconductor chip comprising an optical device, and a first wiring formed over the optical device and electrically connected with the optical device; and
a second semiconductor chip comprising a semiconductor element constituting a part of an electric circuit, and a second wiring formed over the semiconductor element and electrically connected with the semiconductor element,
wherein the second semiconductor chip is mounted on the first semiconductor chip,
wherein a top surface of the first semiconductor chip is laminated with a top surface of the second semiconductor chip such that the first and second wirings are directly contacted with each other, and
wherein the optical device comprises a first optical waveguide comprised of a semiconductor layer, and a second optical waveguide formed at least below the first optical waveguide and comprised of an insulating film.

[Appendix 3]

A semiconductor module comprising:
a first semiconductor chip comprising an optical device, and
a first wiring formed over the optical device and electrically connected with the optical device; and a second semiconductor chip comprising a semiconductor element constituting a part of an electric circuit, and a second wiring formed over the semiconductor element and electrically connected with the semiconductor element, wherein the second semiconductor chip is mounted on the first semiconductor chip, wherein a top surface of the first semiconductor chip is laminated with a top surface of the second semiconductor chip such that the first and second wirings are directly contacted with each other, and wherein the optical device comprises a grating coupler having a concave portion and a convex portion, and wherein the concave portion and the convex portion are provided toward a back surface side of the first semiconductor chip.

[Appendix 4]

A communication method using a semiconductor module comprising:

a first semiconductor chip comprising an optical device, and first wiring formed over the optical device and electrically connected with the optical device; and a second semiconductor chip comprising a semiconductor element constituting a part of an electric circuit, and a second wiring formed over the semiconductor element and electrically connected with the semiconductor element, wherein the second semiconductor chip is mounted on the first semiconductor chip, and wherein a top surface of the first semiconductor chip is laminated with a top surface of the second semiconductor chip such that the first and second wirings are directly contacted with each other, the communication method comprising:

receiving a first electrical signal from an electrical device external the semiconductor module with the first semiconductor chip;

transmitting the first electrical signal received with the first semiconductor chip from the first semiconductor chip to the second semiconductor chip;

processing the first electrical signal received with the second semiconductor chip to a second electrical signal with the semiconductor element;

transmitting the second electrical signal from the second semiconductor chip to the first semiconductor chip;

converting the second electrical signal received with the first semiconductor chip to an optical signal with the optical device; and transmitting the optical signal from the first semiconductor chip to an optical communication device external to the semiconductor module.

[Appendix 5]

A communication method using a semiconductor module comprising:

a first semiconductor chip comprising an optical device, and a first wiring formed over the optical device and electrically connected with the optical device; and a second semiconductor chip comprising a semiconductor element constituting a part of an electric circuit, and a second wiring formed over the semiconductor element and electrically connected with the semiconductor element, wherein the second semiconductor chip is mounted on the first semiconductor chip, and wherein a top surface of the first semiconductor chip is laminated with a top surface of the second semiconductor chip such that the first and second wirings are directly contacted with each other, the communication method comprising:

receiving an optical signal from an optical communication device external to the semiconductor module with the first semiconductor chip;

converting the optical signal received with the first semiconductor chip to a third electronic signal with the optical device;

transmitting the third electrical signal from the first semiconductor chip to the second semiconductor chip;

processing the third electrical signal received with the second semiconductor chip to a fourth electrical signal with the semiconductor element; and transmitting the fourth electrical signal to an electric device external to the semiconductor module through the external connection terminal and the through electrode.

[Appendix 6]

A semiconductor module comprising:

a first semiconductor chip comprising an optical device, and a first wiring formed over the optical device and electrically connected with the optical device; and a second semiconductor chip comprising a semiconductor element constituting a part of an electric circuit, and a second wiring formed over the semiconductor element and electrically connected with the semiconductor element, wherein the second semiconductor chip is mounted on the first semiconductor chip, wherein a top surface of the first semiconductor chip is laminated with a top surface of the second semiconductor chip such that the first and second wirings are directly contacted with each other, and wherein the semiconductor module is capable of communication of an electrical signal and an optical signal with an electric device and an optical communication device external to the semiconductor module in a back surface side of the first semiconductor chip.

What is claimed is:

1. A semiconductor module comprising:

a first semiconductor chip comprising an optical device and a first wiring, the first wiring being formed over the optical device and electrically connected with the optical device; and a second semiconductor chip comprising i) a semiconductor element constituting a part of an electric circuit and ii) a second wiring, the second wiring being formed over the semiconductor element and electrically connected with the semiconductor element, wherein the second semiconductor chip is mounted on the first semiconductor chip, wherein the first semiconductor chip has a first top surface and a first back surface opposite the first top surface, wherein the second semiconductor chip has a second top surface and a second back surface opposite the second top surface, wherein the first top surface of the first semiconductor chip is laminated with the second top surface of the second semiconductor chip such that the first and second wirings are directly in contact with each other, wherein the optical device comprises:

a first optical waveguide formed of a semiconductor layer, the first optical waveguide having i) an upper surface; and a second optical waveguide functioning as a core layer and directly contacting a lower surface of the first optical waveguide, the lower surface being located on a first back surface side of the first semiconductor chip, wherein the first semiconductor chip is formed in the same layer as the first wiring and comprises a first dummy wiring not electrically connected with the optical device, wherein the second semiconductor chip is formed in the same layer as the second wiring and comprises a second dummy wiring not electrically connected with the semiconductor element, and wherein the first dummy wiring is directly in contact with the second dummy wiring.

2. The semiconductor module according to claim 1, wherein an outer periphery of the first semiconductor chip coincides with an outer periphery of the second semiconductor chip in a range of 5 μm or less in plan view.

3. The semiconductor module according to claim 1, wherein each of the first and second semiconductor chips has first and second sides along a first direction, and third and fourth sides along a second direction crossing the first direction in plan view, wherein the first side of the first semiconductor chip and the first side of the second semiconductor chip coincides with each other in range of 5 μm or less, wherein the second side of the first semiconductor chip and the second side of the second semiconductor chip coincides with each other in range of 5 μm or less, wherein the third side of the first semiconductor chip and the third side of the second semiconductor chip coincides with each other in range of 5 μm or less, and wherein the fourth side of the first semiconductor chip and the fourth side of the second semiconductor chip coincides with each other in range of 5 μm or less.

4. The semiconductor module according to claim 1, wherein a semiconductor substrate is provide below the semiconductor element in the second semiconductor chip, and wherein a semiconductor substrate is not provided below the optical device in the first semiconductor chip.

5. The semiconductor module according to claim 1, wherein the first semiconductor chip comprises:
a first multilayer wiring formed over the optical device and comprising the first wiring;
a first insulating film formed below the optical device and formed on the first back surface side of the first semiconductor chip;
a pad electrode formed on a lower surface of the first insulating film;
a through electrode penetrating the first insulating film and electrically connected with the pad electrode and the first wiring; and
an external connection terminal formed on a lower surface of the pad electrode, wherein the second semiconductor chip comprises:
a semiconductor substrate having a third top surface and a third back surface; and
a second multilayer wiring formed over the third top surface of the semiconductor substrate and comprising the second wiring, and wherein the semiconductor element is formed on the third top surface of the semiconductor substrate.

6. A communication method using the semiconductor module according to claim 5, the communication method comprising:

receiving a first electrical signal from an electric device external with the semiconductor module through the external connection terminal and the through electrode with the first semiconductor chip;

transmitting the first electrical signal received with the first semiconductor chip from the first semiconductor chip to the second semiconductor chip;

processing the first electrical signal received with the second semiconductor chip to a second electrical signal with the optical device;

transmitting the second electrical signal from the second semiconductor chip to the first semiconductor chip;

converting the second electrical signal received with the first semiconductor chip to an optical signal with the optical device; and transmitting the optical signal from first semiconductor chip to an optical communication device external to the semiconductor module.

7. A communication method using the semiconductor module according to claim 5, the communication method comprising:

receiving an optical signal from an optical device external to the semiconductor module with the first semiconductor chip;

converting the optical signal received with the first semiconductor chip to a third electrical signal with the optical device;

transmitting the third electrical signal from the first semiconductor chip to the second semiconductor chip;

processing the third electrical signal received with the second semiconductor chip to a fourth electrical signal with the semiconductor element; and transmitting the fourth electrical signal to an electrical device external to the semiconductor module through the external connection terminal and the through electrode.

8. The semiconductor module according to claim 1, wherein the first semiconductor chip comprises:
a first insulating film formed below the optical device; and
a second insulating film formed on a lower surface of the first insulating film, and wherein the optical device comprises:
a first optical waveguide formed on the first insulating film; and
a second optical waveguide formed between the first and second insulating films.

9. The semiconductor module according to claim 1, wherein the second optical waveguide covers the lower surface and a side surface of the first optical waveguide.

10. The semiconductor module according to claim 1, wherein the optical device comprises an optical receiver, wherein a first insulating film is formed below the optical receiver, and wherein the first insulating film is exposed on the first back surface of the first semiconductor chip.

11. The semiconductor module according to claim 10, wherein a reflective film is formed over the optical receiver.

12. The semiconductor module according to claim 11, wherein the reflective film is made of the same material as the first wiring.

13. The semiconductor module according to claim 10, wherein the optical receiver is capable of receiving light from an optical communication device external with the semiconductor module in the first back surface side of the first semiconductor chip.

14. A semiconductor module comprising:

a first semiconductor chip comprising an optical device, and a first wiring formed over the optical device and electrically connected with the optical device; and a second semiconductor chip comprising a semiconductor element constituting a part of an electric circuit, and a second wiring formed over the semiconductor element and electrically connected with the semiconductor element, wherein the second semiconductor chip is mounted on the first semiconductor chip, wherein the first semiconductor chip has a first top surface and a first back surface opposite the first top surface, wherein the second semiconductor chip has a second top surface and a second back surface opposite the second top surface, wherein the first top surface of the first semiconductor chip is laminated with the second top surface of the second semiconductor chip such that the first and second wirings are directly contacted with each other, wherein the optical device comprises a grating coupler having a recess and a protrusion, wherein the recess and the protrusion of the grating coupler face toward a back surface side of the first semiconductor chip, wherein the recess is formed on a lower surface of a semiconductor layer so that the recess does not penetrate through to another surface of the semiconductor layer, the lower surface of the semiconductor layer being located on a first back surface side of the first semiconductor chip, wherein a first insulating film is formed below the grating coupler, wherein the first insulating film is exposed on the first back surface of the first semiconductor chip, wherein the first semiconductor chip is formed in the same layer as the first wiring and comprises a first dummy wiring not electrically connected with the optical device, wherein the second semiconductor chip is formed in the same layer as the second wiring and comprises a second dummy wiring not electrically connected with the semiconductor element, and wherein the first dummy wiring is directly in contact with the second dummy wiring.

15. The semiconductor module according to claim 14, wherein a reflective film is formed over the grating coupler.

16. The semiconductor module according to claim 15, wherein the reflective film is made of the same material as the first wiring.

17. The semiconductor module according to claim 14, wherein the grating coupler is capable of performing optical communication with an optical communication device external with the semiconductor module in the first back surface side of the first semiconductor chip.

* * * * *